United States Patent
Aoshima

(10) Patent No.: US 10,126,655 B2
(45) Date of Patent: Nov. 13, 2018

(54) METHOD FOR PRODUCING A PLANOGRAPHIC PRINTING PLATE

(71) Applicant: Norio Aoshima, Shizuoka-ken (JP)

(72) Inventor: Norio Aoshima, Shizuoka-ken (JP)

(73) Assignee: Fujifilm Corporation, Tokyo (JP)

( * ) Notice: Subject to any disclaimer, the term of this patent is extended or adjusted under 35 U.S.C. 154(b) by 469 days.

(21) Appl. No.: 14/449,166

(22) Filed: Aug. 1, 2014

(65) Prior Publication Data
US 2016/0054654 A1 Feb. 25, 2016

Related U.S. Application Data

(62) Division of application No. 13/027,282, filed on Feb. 15, 2011, now Pat. No. 8,828,648.

(30) Foreign Application Priority Data

| Feb. 17, 2010 | (JP) | ................................. 2010-032566 |
| Mar. 23, 2010 | (JP) | ................................. 2010-066790 |
| Mar. 26, 2010 | (JP) | ................................. 2010-072974 |

(51) Int. Cl.
*G03F 7/32* (2006.01)
*G03F 7/30* (2006.01)
(Continued)

(52) U.S. Cl.
CPC .............. *G03F 7/30* (2013.01); *B41C 1/1008* (2013.01); *G03F 7/20* (2013.01); *G03F 7/322* (2013.01);
(Continued)

(58) Field of Classification Search
CPC ....................................................... G03F 7/11
See application file for complete search history.

(56) References Cited

U.S. PATENT DOCUMENTS

| 7,163,770 B1 | 1/2007 | Saraiya et al. |
| 2003/0099909 A1 | 5/2003 | Takamiya |
| | (Continued) | |

FOREIGN PATENT DOCUMENTS

| CN | 1989459 A | 6/2007 |
| CN | 101370659 | 2/2009 |
| | (Continued) | |

OTHER PUBLICATIONS

EESR dated Sep. 27, 2011, issued in corresponding European Patent Application.
(Continued)

*Primary Examiner* — Chanceity N Robinson
(74) *Attorney, Agent, or Firm* — Solaris Intellectual Property Group, PLLC

(57) ABSTRACT

Provided is a method of producing a planographic printing plate, including: subjecting a planographic printing plate precursor, which has a support and a positive-working image recording layer, to image-wise exposure; and developing it using an alkaline aqueous solution which contains a specific compound and has a pH of from 8.5 to 10.8, in this order. The recording layer has: a lower layer containing a water-insoluble and alkali-soluble resin and an infrared ray absorbing agent; and an upper layer containing a water-insoluble and alkali-soluble polyurethane resin and a polyorganosiloxane. The specific compound is a nonionic or anionic surfactant, or at least one compound represented by Formula (1) or (2), wherein $R^{11}$, $R^{12}$, and $R^{13}$ each represent an alkyl group; $R^{14}$ represents an alkylene group; and $R^{15}$ represents a single bond or a divalent linking group containing a hetero atom; and $R^{21}$, $R^{22}$, and $R^{23}$ each represent an alkyl group.
(Continued)

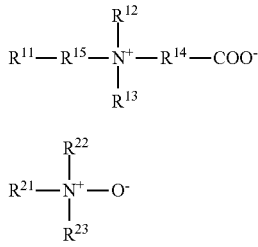

(1)

(2)

15 Claims, 1 Drawing Sheet

(51) Int. Cl.
*B41C 1/10* (2006.01)
*G03F 7/20* (2006.01)

(52) U.S. Cl.
CPC ........ *B41C 1/1016* (2013.01); *B41C 2210/02* (2013.01); *B41C 2210/06* (2013.01); *B41C 2210/14* (2013.01); *B41C 2210/22* (2013.01); *B41C 2210/24* (2013.01); *B41C 2210/262* (2013.01); *B41C 2210/266* (2013.01)

(56) References Cited

U.S. PATENT DOCUMENTS

| | | | |
|---|---|---|---|
| 2004/0185374 A1 | 9/2004 | Takamiya | |
| 2005/0266349 A1 | 12/2005 | Van Damme et al. | |
| 2007/0172764 A1 | 7/2007 | Saraiya et al. | |
| 2009/0186301 A1* | 7/2009 | Ray | B41C 1/1016 430/302 |
| 2009/0197052 A1 | 8/2009 | Levanon et al. | |
| 2009/0208869 A1 | 8/2009 | Kamiya et al. | |
| 2011/0020094 A1 | 1/2011 | Kubo et al. | |
| 2011/0200943 A1* | 8/2011 | Aoshima | 430/302 |

FOREIGN PATENT DOCUMENTS

| | | | |
|---|---|---|---|
| CN | 101370659 A * | 2/2009 | ........... B41C 1/1016 |
| EP | 1287986 | 3/2003 | |
| EP | 1462251 | 9/2004 | |
| JP | 8-248625 | 9/1996 | |
| JP | 11-338126 | 12/1999 | |
| JP | 2001-324819 | 11/2001 | |
| JP | 2003-015319 | 1/2003 | |
| JP | 2003-248300 | 9/2003 | |
| JP | 2004-102060 | 4/2004 | |
| JP | 2004-272152 | 9/2004 | |
| JP | 2004-279806 | 10/2004 | |
| JP | 2007-017913 | 1/2007 | |
| WO | 2007/23336 | 3/2007 | |
| WO | WO 2007087162 A2 * | 8/2007 | ........... B41C 1/1016 |
| WO | 2009/094120 | 7/2009 | |

OTHER PUBLICATIONS

Japanese Office Action dated Jun. 18, 2013, issued in corresponding Japanese Patent Application No. 2010-066790.
Japanese Office Action dated Jun. 18, 2013, issued in corresponding Japanese Patent Application No. 2010-072974.
Chinese Office Action dated Dec. 19, 2013, issued in corresponding Chinese Patent Application.
English language translation of the following: Office action dated Dec. 4, 2017 from the SIPO in a Chinese patent application No. 201410541633.3 corresponding to the instant patent application.
English language translation of the following: Office action dated Jul. 5, 2017 from the SIPO in a Chinese patent application No. 201410541624.4 corresponding to the instant patent application.

* cited by examiner

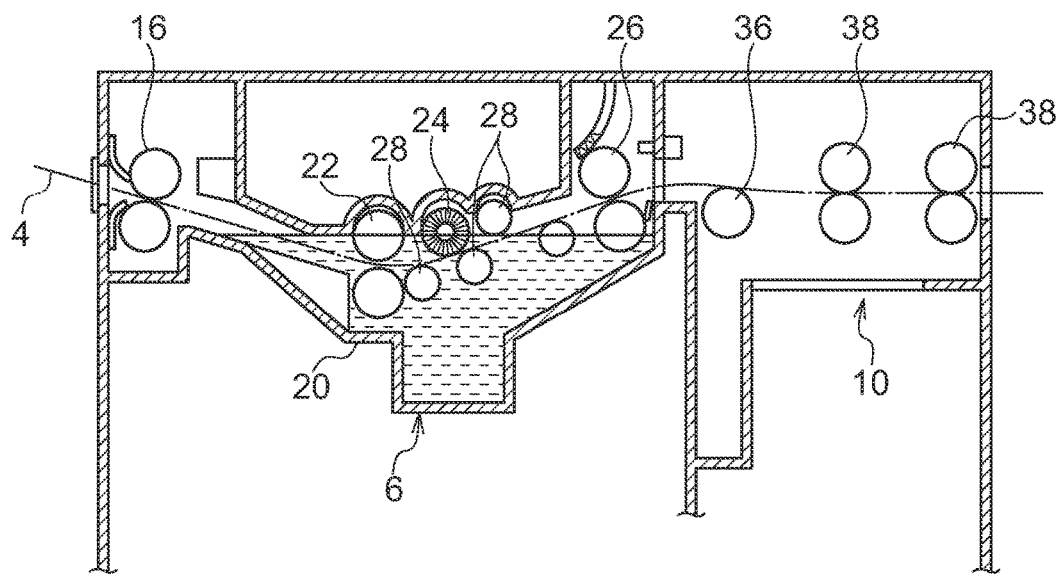

METHOD FOR PRODUCING A PLANOGRAPHIC PRINTING PLATE

CROSS-REFERENCE TO RELATED APPLICATION

This application is a divisional of, and claims priority under 35 USC 120 to, U.S. Ser. No. 13/027,282 filed Feb. 15, 2011, which claims priority under 35 USC 119 to Japanese Patent Application No. 2010-032566 filed on Feb. 17, 2010, Japanese Patent Application No. 2010-066790 filed on Mar. 23, 2010, and Japanese Patent Application No. 2010-072974 filed on Mar. 26, 2010, the disclosures of which are incorporated by reference herein.

BACKGROUND OF THE INVENTION

Field of the Invention

The invention relates to a method of producing a planographic printing plate, and particularly to a method of producing a planographic printing plate providing good processability.

Description of the Related Art

In general, planographic printing plates have lipophilic image areas which receive ink during printing, and hydrophilic non-image areas which receive dampening water. Planography is a process of printing based on repellency between water and printing ink, in which lipophilic image areas of a planographic printing plate work as ink receptive areas, and hydrophilic non-image areas thereof work as dampening water receptive areas (non-ink receptive areas), whereby the ink unevenly adheres to the surface of the planographic printing plate, deposits on the image areas alone, and is transferred to a medium such as paper.

In order to make a planographic printing plate, a planographic printing plate precursor (PS plate) composed of a hydrophilic support having thereon a lipophilic photosensitive resin layer (e.g., a photosensitive layer, or an image recording layer) has been widely used. Usually, a planographic printing plate is obtained by plate-making including an exposure step in which a planographic printing plate precursor is subjected to image-wise exposure through an original image such as a lith film, and a development step in which unnecessary portions of the image recording layer are removed by dissolution in an alkaline developer or organic solvent with the portions to be image areas of the image recording layer remained, to expose the hydrophilic support surface to form non-image areas.

As described above, in the prior art process of making a planographic printing plate precursor, a development step must be carried out after exposure thereby removing unnecessary portions of the image recording layer by dissolution in a developer or the like. However, from the viewpoints of environment and safety, it is required that the alkaline aqueous solution used for development be an aqueous solution having a pH close to neutral, and the amount of waste water discharged in the development step be reduced. In recent years, in consideration of global environment, disposal of waste water discharged in wet processing is a growing concern in the whole industries. Therefore, solutions of the problems are increasingly desired.

In recent years, digitization techniques for electronically processing, accumulating, and outputting image information using computers have been widely used, and various kinds of new image output systems suitable for these digitization techniques are put into actual use. Along with this, the computer-to-plate (CTP) technique is receiving attention. According to the technique, digitized image information is carried by a highly convergent radiation such as laser light, and a planographic printing plate precursor is scanned by and exposed to the light, whereby a planographic printing plate is directly produced without using a lith film. In particular, image recording materials usable for infrared laser recording are increasingly used, because they can be handled in incandescent light (white light). Of these image recording materials, positive-working image recording materials are receiving attention, which contain an infrared ray absorbing dye having a light-to-heat conversion property, and a phenol resin which prevents dissolution into a developer.

Usually, in the positive-working image recording material, the infrared laser exposure and heat generated by a light-to-heat converting agent hinder the dissolution preventive effect of the exposed regions to improve the solubility of the image recording layer in the regions, and the regions are removed by the development step to make a planographic printing plate. In general, after the development, a washing treatment with water is carried out to remove extra portions of the alkaline developer, followed by gumming, and then the planographic printing plate is used for printing.

The development treatment is usually carried out in an automatic developing machine. However, when the dissolved image recording layer increases in the developer, it precipitates to form development wastes (development scums). When a considerable amount of development wastes is generated, the wastes may adhere to the planographic printing plate after plate making to cause image defects. In particular, image recording layers usable for infrared laser recording tend to generate development wastes because they contain a photothermal converting agent having a relatively high molecular weight.

Since the alkaline developer used in the development step preferably has a pH close to neutral from the viewpoint of environment, various attempts have been made for achieving this. For example, International Publication No. 2009/094120A1 proposes a plate making method including treating a planographic printing plate precursor, which has a positive-working image recording layer having a layered structure, using a developer having a pH of from 6 to 11. However, reduction of pH in the alkaline developer alone cannot prevent the problem regarding developability, or the increase of development wastes due to the deterioration of the solubility of the image recording layer after repeated plate making using an automatic developing machine. As a result of this, development wastes may adhere to the plate surface after plate making to cause image defects.

Further, in order to improve hydrophilicity of the non-image areas and protect the plate surface of a planographic printing plate, it is usually preferred that the plate surface after development and water washing be subjected to a hydrophilizing treatment, which is called a gumming treatment. However, since the gumming treatment is a wet process, the same problems of waste water as in the case of the development step arise.

SUMMARY OF THE INVENTION

The present invention is made in consideration of the problems with prior art. An object of the invention is to provide a method of producing a planographic printing plate, the planographic printing plate providing good developability while preventing the generation of development wastes during printing of many sheets, or preventing time-dependent generation of development wastes, even when an alkaline developer with a relatively low pH is used.

Another object of the invention is to provide a method of producing a planographic printing plate which requires no water washing step or gumming step after the development step using an alkaline aqueous solution, and thus allows plate making through one-bath treatment.

The first aspect of the invention is described below.

<1> A method of making a planographic printing plate, comprising, in the following order:

subjecting a planographic printing plate precursor, which comprises a support and a positive-working image recording layer provided on the support, to image-wise exposure; and developing the planographic printing plate precursor using an alkaline aqueous solution which comprises a non-ionic surfactant and has a pH of from 8.5 to 10.8.

<2> The method of making a planographic printing plate according to <1>, wherein the positive-working image recording layer comprises: a lower layer comprising a (A) water-insoluble and alkali-soluble resin and an (B) an infrared ray absorbing agent; and an upper layer comprising a (C) water-insoluble and alkali-soluble polyurethane resin and a (D) polyorganosiloxane.

<3> The method of making a planographic printing plate according to <1> or <2>, wherein the (A) water-insoluble and alkali-soluble resin comprises a resin having at least one group selected from the group consisting of a phenolic hydroxyl group, a carboxyl group, sulfonic acid group, a phosphoric acid group, a sulfonamide group, and an active imide group.

<4> The method of making a planographic printing plate according to any one of <1> to <3>, wherein the (B) infrared ray absorbing agent comprises a cyanine dye.

<5> The method of making a planographic printing plate according to any one of <1> to <4>, wherein the (C) water-insoluble and alkali-soluble polyurethane resin comprises a polyurethane resin having a carboxyl group in a polymer backbone thereof.

<6> The method of making a planographic printing plate according to any one of <1> to <5>, wherein the upper layer further comprises a (B) infrared ray absorbing agent.

<7> The method of making a planographic printing plate according to any one of <1> to <6>, wherein a content of a water-soluble polymer compound in the alkaline aqueous solution is 10 ppm or less.

<8> The method of making a planographic printing plate according to any one of <1> to <7>, wherein the development comprises a one-bath treatment using the alkaline aqueous solution.

The second aspect of the invention is described below.

<9> A method of making a planographic printing plate, comprising in the following order:

subjecting a planographic printing plate precursor, which comprises a support and a positive-working image recording layer provided on the support, to image-wise exposure; and developing the planographic printing plate precursor using an alkaline aqueous solution which comprises at least one of a compound represented by the following Formula (1) or a compound represented by the following Formula (2) and has a pH of from 8.5 to 10.8:

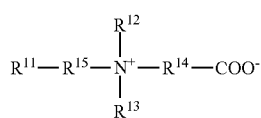

(1)

-continued

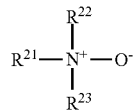

(2)

wherein, in Formula (1), $R^{11}$, $R^{12}$, and $R^{13}$ each independently represent an alkyl group; $R^{14}$ represents an alkylene group; and $R^{15}$ represents a single bond or a divalent linking group containing a hetero atom; and in Formula (2), $R^{21}$, $R^{22}$, and $R^{23}$ each independently represent an alkyl group.

<10> The method of making a planographic printing plate according to <9>, wherein the positive-working image recording layer comprises: a lower layer comprising a (A) water-insoluble and alkali-soluble resin and an (B) an infrared ray absorbing agent; and an upper layer comprising a (C) water-insoluble and alkali-soluble polyurethane resin and a (D) polyorganosiloxane.

<11> The method of making a planographic printing plate according to <9> or <10>, wherein the (A) water-insoluble and alkali-soluble resin comprises a resin having at least one group selected from the group consisting of a phenolic hydroxyl group, a carboxyl group, sulfonic acid group, a phosphoric acid group, a sulfonamide group, and an active imide group.

<12> The method of making a planographic printing plate according to any one of <9> to <11>, wherein the (B) infrared ray absorbing agent comprises a cyanine dye.

<13> The method of making a planographic printing plate according to any one of <9> to <12>, wherein the (C) water-insoluble and alkali-soluble polyurethane resin comprises a polyurethane resin having a carboxyl group in a polymer backbone thereof.

<14> The method of making a planographic printing plate according to any one of <9> to <13>, wherein the upper layer further comprises a (B) infrared ray absorbing agent.

<15> The method of making a planographic printing plate according to any one of <9> to <14>, wherein a content of a water-soluble polymer compound in the alkaline aqueous solution is 10 ppm or less.

<16> The method of making a planographic printing plate according to any one of <9> to <15>, wherein the development comprises a one-bath treatment using the alkaline aqueous solution.

The third aspect of the invention is described below.

<17> A method of making a planographic printing plate, comprising, in the following order:

subjecting a planographic printing plate precursor, which comprises a support and a positive-working image recording layer provided on the support, to image-wise exposure; and developing the planographic printing plate precursor using an alkaline aqueous solution which comprises an anionic surfactant and has a pH of from 8.5 to 10.8, the recording layer comprising: a lower layer comprising a (A) water-insoluble and alkali-soluble resin and an (B) infrared ray absorbing agent; and an upper layer comprising a (C) water-insoluble and alkali-soluble polyurethane resin and a (D) polyorganosiloxane.

<18> The method of making a planographic printing plate according to <17>, wherein the (A) water-insoluble and alkali-soluble resin comprises a resin having at least one group selected from the group consisting of a phenolic hydroxyl group, a carboxyl group, sulfonic acid group, a phosphoric acid group, a sulfonamide group, and an active imide group.

<19> The method of making a planographic printing plate according to <17> or <18>, wherein the (B) infrared ray absorbing agent comprises a cyanine dye.

<20> The method of making a planographic printing plate according to any one of <17> to <19>, wherein the (C) water-insoluble and alkali-soluble polyurethane resin comprises a polyurethane resin having a carboxyl group in a polymer backbone thereof.

<21> The method of making a planographic printing plate according to any one of <17> to <20>, wherein the upper layer further comprises a (B) infrared ray absorbing agent.

<22> The method of making a planographic printing plate according to any one of <17> to <21>, wherein a content of a water-soluble polymer compound in the alkaline aqueous solution is 10 ppm or less.

<23> The method of making a planographic printing plate according to any one of <17> to <22>, wherein the development comprises a one-bath treatment using the alkaline aqueous solution.

According to an aspect of the invention, there is provided a method for making a planographic printing plate, the planographic printing plate providing good developability while preventing the generation of development wastes during printing of many sheets, or preventing time-dependent generation of development wastes, even when an alkaline developer with a relatively low pH is used.

According to another aspect of the invention, a method for making a planographic printing plate is provided, which requires no water washing step or gumming step after the development step using an alkaline aqueous solution, and thus allows plate making through one-bath treatment.

BRIEF DESCRIPTION OF THE DRAWINGS

FIG. 1 is a schematic cross sectional view showing one aspect of the structure of an automatic processor useful for a method for making a planographic printing plate of the invention.

DETAILED DESCRIPTION OF THE INVENTION

Hereinafter, the method for making a planographic printing plate of the invention (hereinafter may be referred simply to as "making method of the invention" or "production method of the invention") is further described in detail.
First to Third Aspects A method for making a planographic printing plate according to a first aspect of the invention includes: subjecting a planographic printing plate precursor, which has at least a support and a positive-working image recording layer on the support, to image-wise exposure (exposure step); and developing the planographic printing plate precursor after the image-wise exposure using an alkaline aqueous solution (hereinafter may be referred to as "specific developer according to the first aspect") which contains a nonionic surfactant and has a pH of from 8.5 to 10.8 (development step), in this order.

Since the making method according to the first aspect of the invention includes the exposure and development steps, good developability is achieved while the generation of development wastes are prevented during printing many sheets, even when an alkaline developer having a relatively low pH is used.

A method for making a planographic printing plate according to a second aspect of the invention includes: subjecting a planographic printing plate precursor, which has at least a support and a positive-working image recording layer on the support, to image-wise exposure (exposure step); and developing the planographic printing plate precursor after the image-wise exposure using an alkaline aqueous solution (hereinafter may be referred to as "specific developer according to the second aspect") which contains at least one of a compound represented by the following Formula (1) or a compound represented by the following Formula (2) and has a pH of from 8.5 to 10.8 (development step), in this order.

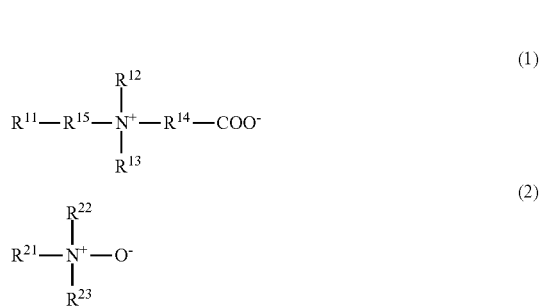

In Formula (1), $R^{11}$, $R^{12}$, and $R^{13}$ each independently represent an alkyl group, $R^{14}$ represents an alkylene group, and $R^{15}$ represents a single bond or a divalent linking group containing a hetero atom.

In Formula (2), $R^{21}$, $R^{22}$, and $R^{23}$ each independently represent an alkyl group.

Since the making method according to the second aspect of the invention includes the exposure and development steps, good developability is achieved, and the time-dependent generation of development wastes is prevented, even when an alkaline developer having a relatively low pH is used.

First, the first and second aspects of the invention are described below.

In the making method according to the first and second aspects of the invention, the development step may be carried out by one-bath treatment using the specific developer according to the first or second aspect. In this case, after the development step using the specific developer according to the first or second aspect of the invention having a relatively low pH, the planographic printing plate is directly used for printing, without undergoing a rinse (or water washing) or gumming process, which is a widely used common process. The making method according to the first and second aspects of the invention effectively prevents the time-dependent generation of development wastes even when the development step is carried out by one-bath treatment, and thus provides good stability of the development system.

In the making method according to the first and second aspects of the invention, a developer having a lower pH than that used for a common positive-working planographic printing plate precursor is used, and when an upper layer of the image recording layer of a positive-working planographic printing precursor contains a polyorganosiloxane, a higher developer resistance of the image recording layer is achieved. Accordingly, the planographic printing plate thus obtained provides good printing durability with less deterioration in strength of the image recording layer. In particular, when the making method according to the first and second aspects of the invention is used, a planographic printing plate with good printing durability is obtained, even when the development step is carried out by one-bath treatment, and a long period of time has passed before the planographic printing plate thus obtained is used for printing.

Next, a third aspect of the invention is described below.

The method for making a planographic printing plate according to the third aspect of the invention includes, in the following order: subjecting a positive-working planographic printing plate precursor to image-wise exposure (exposure step), the positive-working planographic printing plate precursor having at least a support, and on the support, an image recording layer including a lower layer containing a (A) water-insoluble and alkali-soluble resin and an (B) infrared ray absorbing agent, and an upper layer containing a (C) water-insoluble and alkali-soluble polyurethane resin and a (D) polyorganosiloxane; and developing the positive-working planographic printing plate precursor after the image-wise exposure using an alkaline aqueous solution which contains an anionic surfactant and has a pH of from 8.5 to 10.8 (development step).

Hereinbelow, the structure of a planographic printing plate precursor which is applicable to the making method according to the first to third aspects of the invention, and the exposure step and development step of the making method according to the first to third aspects of the invention, are described sequentially.

Planographic Printing Plate Precursor

The planographic printing plate precursor used in the making method according to the first to third aspects of the invention includes a support having thereon a positive-working image recording layer.

The positive-working image recording layer included in the planographic printing plate precursor used in the making method according to the first to third aspects of the invention includes: a lower layer including a (A) water-insoluble and alkali-soluble resin and an (B) infrared ray absorbing agent; and an upper layer including a (C) water-insoluble and alkali-soluble polyurethane resin and a (D) polyorganosiloxane. The image recording layer is further described below.

Regarding preferred embodiments of the positive-working image recording layer included in the planographic printing plate precursor according to the first to third aspects of the invention, the components of the lower layer and upper layer are described below sequentially.

(A) Water-Insoluble and Alkali-Soluble Resin

The lower layer of the image recording layer includes a (A) water-insoluble and alkali-soluble resin.

The water-insoluble and alkali-soluble resin (A) contained in the lower layer is not particularly limited as long as it is insoluble in water and is soluble in an alkaline developer. The water-insoluble and alkali-soluble resin (A) is preferably a homopolymer having an acidic group in the polymer backbone and/or a side chain, a copolymer of such homopolymers, or a mixture of these polymers.

Examples of alkali-soluble resin having an acidic group include resins having a functional group (i.e., an acidic group) such as —COOH, —SO$_3$H, —OSO$_3$H, —PO$_3$H$_2$, —OPO$_3$H$_2$, —CONHSO$_2$, —SO$_2$NHSO$_2$—, a phenolic hydroxyl group, or an active imide group. Among them, resins having a functional group such as —COOH, —SO$_3$H, —OPO$_3$H$_2$, or —SO$_2$NHSO$_2$— are preferred, and resins having —COOH are particularly preferred.

Accordingly, the resin may favorably be obtained by polymerizing a mixture of monomers including at least one ethylenically unsaturated monomer having the above-described functional group (hereinafter may be referred to as "alkali-solubility-imparting monomer"). Examples of the alkali-solubility-imparting monomer include acrylic acid, methacrylic acid, a compound represented by the following formula, and mixtures thereof. In the following formula, each $R^4$ represents a hydrogen atom or $CH_3$.

In the present specification, "(meth)acrylate" means acrylate and/or methacrylate, and "(meth)acryl" means acryl and/or methacryl.

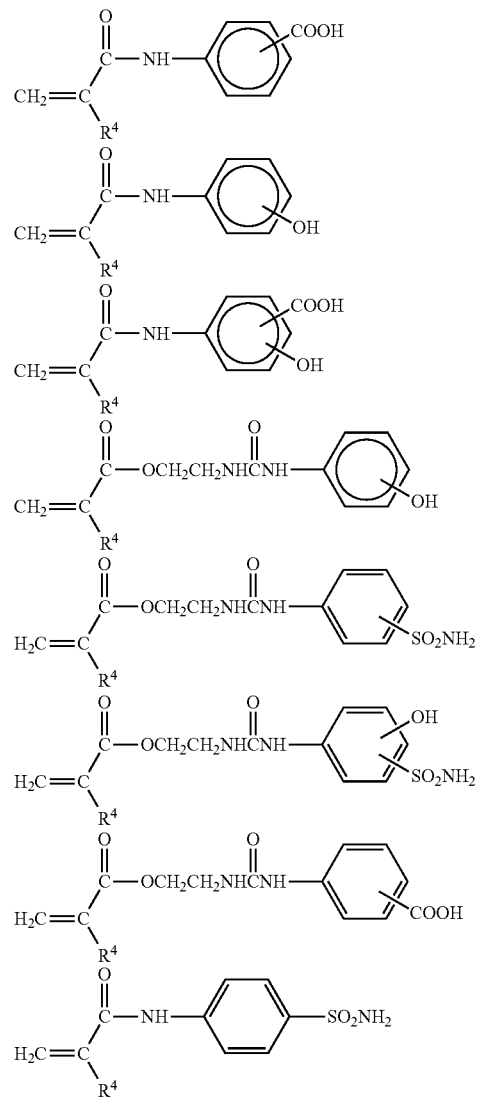

The water-insoluble and alkali-soluble resin (A) is preferably a polymer compound obtained by copolymerizing an alkali-solubility-imparting monomer with another polymerizable monomer. In this case, the copolymerization ratio of the alkali-solubility-imparting monomer is preferably 10 mol % or more and 70 mol % or less, and more preferably 20 mol % or more. When the copolymerization ratio of the alkali-solubility-imparting monomer is within the range, the resin is insoluble in water and soluble in an alkaline developer, and thus providing good developability.

Examples of another polymerizable monomer useful for the preparation of the water-insoluble and alkali-soluble resin (A) include the following compounds:

alkyl acrylates and alkyl methacrylates, such as methyl acrylate, ethyl acrylate, propyl acrylate, benzyl acrylate, methyl methacrylate, ethyl methacrylate, cyclohexyl methacrylate, and benzyl methacrylate;

acrylates and methacrylates having an aliphatic hydroxyl group, such as 2-hydroxyethyl acrylate and 2-hydroxyethyl methacrylate;

acrylamides and methacrylamides, such as acrylamide, methacrylamide, N-methylacrylamide, N-ethyl acrylamide, and N-phenyl acrylamide;

vinyl esters such as vinyl acetate, vinyl chloroacetate, vinyl butylate, and vinyl benzoate;

styrenes such as styrene, α-methylstyrene, methylstyrene, and chloromethylstyrene;

other nitrogen atom-containing monomers such as N-vinylpyrrolidone, N-vinylpyridine, acrylonitrile, and methacrylonitrile; and maleimides such as N-methylmaleimide, N-ethylmaleimide, N-propyl maleimide, N-butyl maleimide, N-phenyl maleimide, N-2-methylphenyl maleimide, N-2,6-diethylphenyl maleimide, N-2-chlorophenyl maleimide, N-cyclohexyl maleimide, N-lauryl maleimide, and N-hydroxyphenyl maleimide.

Among these ethylenically unsaturated co-monomers, (meth)acrylates, (meth)acrylamides, maleimides, and (meth)acrylonitrile are preferred.

Specific examples of the copolymer of the water-insoluble and alkali-soluble resin (A) are shown below. The weight average molecular weights of the specific compounds shown below are from 20,000 to 50,000. The invention will not be limited to the following specific examples.

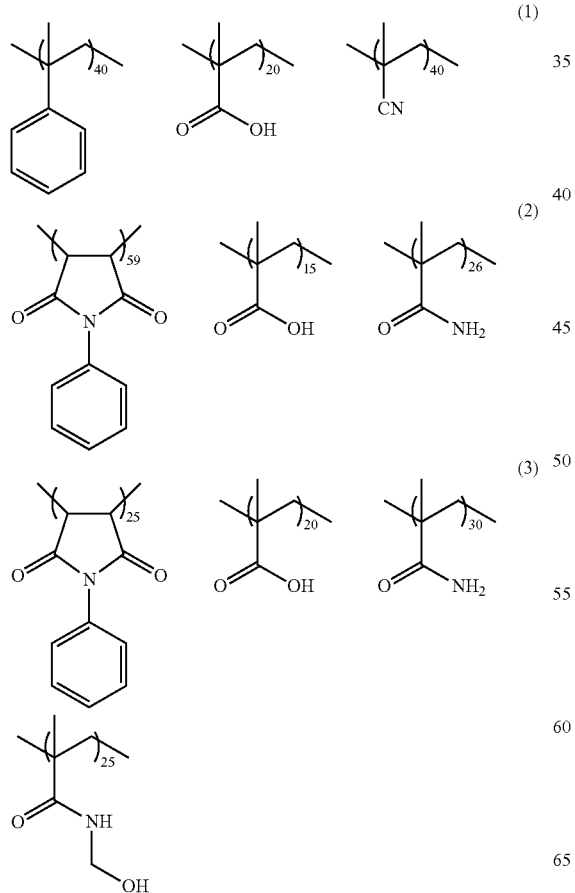

(1)

(2)

(3)

(4)
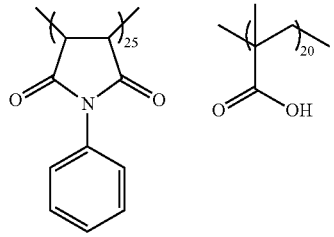
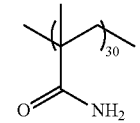

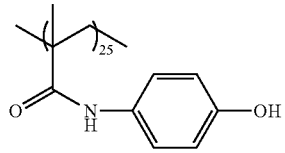

(5)
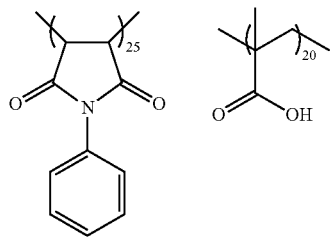
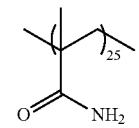

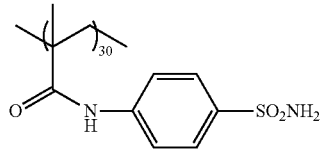

(6)
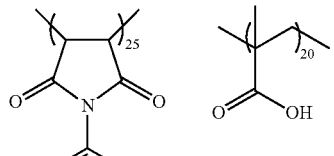
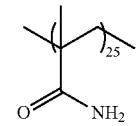

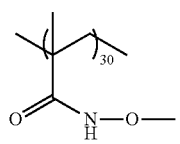

(7)
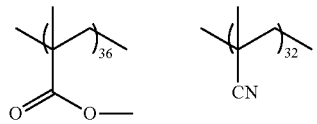

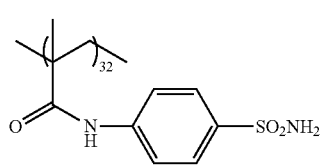

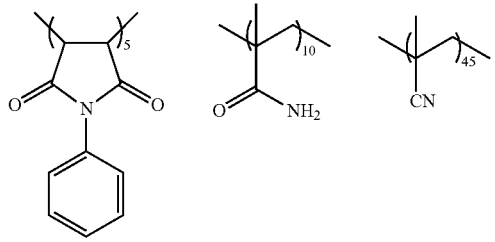
(8)

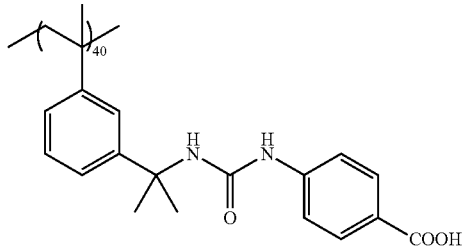
(9)

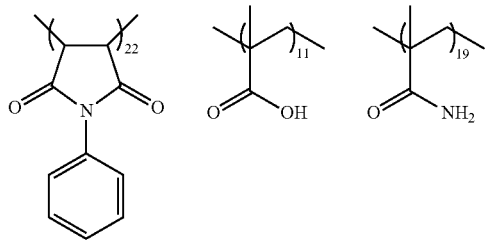
(10)

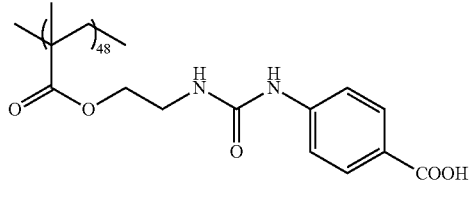
(11)

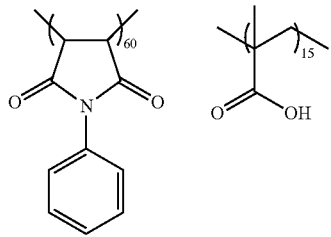
(12)

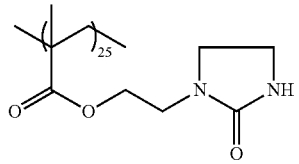
(13)

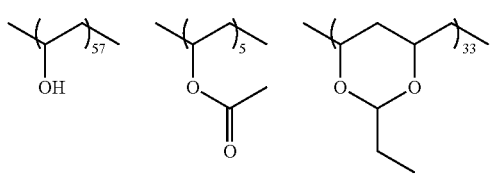

Other preferred examples of the water-insoluble and alkali-soluble resin (A) include resins having a phenolic hydroxyl group. Examples of the resin having a phenolic hydroxyl group include novolac resins such as phenol formaldehyde resin, m-cresol formaldehyde resin, p-cresol formaldehyde resin, m-/p-mixed cresol formaldehyde resin, phenol/cresol (m-, p-, or m-/p-mixed) mixed formaldehyde resins.

Furthermore, phenol-formaldehyde condensates substituted with an alkyl group having 3 to 8 carbon atoms, such as the t-butylphenol formaldehyde resins and octylphenol formaldehyde resins as disclosed in U.S. Pat. No. 4,123,279 may be used in combination with the (A) water-insoluble and alkali-soluble resin.

The resins having a phenolic hydroxyl group may be used alone, or in combination of two or more thereof.

The water-insoluble and alkali-soluble resin (A) preferably has a weight average molecular weight of 2,000 or more, and a number average molecular weight of 500 or more, and more preferably has a weight average molecular weight of from 5,000 to 300,000, a number average molecular weight of from 800 to 250,000, and a dispersivity (i.e., weight average molecular weight/number average molecular weight) of from 1.1 to 10. The molecular weights are measured by GPC (gel permeation chromatography), and calculated in terms of the molecular weight of polystyrene standard.

The water-insoluble and alkali-soluble resin (A) contained in a lower layer may be used alone, or in combination of two or more thereof.

The content of the water-insoluble and alkali-soluble resin (A) with respect to the total solid of the lower layer is preferably from 50% by mass to 98% by mass, and more preferably from 65% by mass to 95% by mass. When the content of the water-insoluble and alkali-soluble resin (A) is within the above ranges, the image recording layer has a high sensitivity and good durability.

(B) Infrared Ray Absorbing Agent

The lower layer of the image recording layer according to the first to third aspects of the invention includes at least an (B) infrared ray absorbing agent.

The infrared ray absorbing agent (B) is not particularly limited as long as it is a dye or pigment which absorbs infrared light to generate heat, and may be selected from various dyes and pigments known as infrared ray absorbing agents.

Examples of the dye used as the infrared ray absorbing agent include cyanine dyes as disclosed in Japanese Patent Application Laid-Open (JP-A) Nos. 58-125246, 59-84356, 59-202829, and 60-78787, methine dyes as disclosed in JP-A Nos. 58-173696, 58-181690, and 58-194595, naphthoquinone dyes as disclosed in JP-A Nos. 58-112793, 58-224793, 59-48187, 59-73996, 60-52940, and 60-63744, squarylium dyes as disclosed in JP-A No. 58-112792, and cyanine dyes as disclosed in U.K. Patent No. 434,875.

Preferred examples of the dye used as the infrared ray absorbing agent include the near-infrared absorption sensitizers as disclosed in U.S. Pat. No. 5,156,938, substituted aryl benzo(thio)pyrylium salts as disclosed in U.S. Pat. No. 3,881,924, the trimethine thiopyrylium salts as disclosed in JP-A No. 57-142645 (U.S. Pat. No. 4,327,169), the pyrylium compounds as disclosed in JP-A Nos. 58-181051, 58-220143, 59-41363, 59-84248, 59-84249, 59-146063, and 59-146061, the cyanine dyes as disclosed in JP-A No. 59-216146, the pentamethine thiopyrylium salts as disclosed in U.S. Pat. No. 4,283,475, and pyrylium compounds as disclosed in Japanese Patent Application Publication (JP-B) Nos. 5-13514, and 5-19702. Among commercial products, EPOLIGHT 111-178, EPOLIGHT III-130, and EPOLIGHT 111-125 (trade names, manufactured by Epoline Corp.) are preferably exemplified.

Other examples of particularly preferred dye include near-infrared absorption dyes represented by the formulae (I) and (II) in U.S. Pat. No. 4,756,993.

Examples of the infrared ray absorbing agent included in the lower layer include the compounds shown below.

Among them, cyanine dyes A and F are particularly preferred infrared ray absorbing agent dyes.

Cyanine dye A

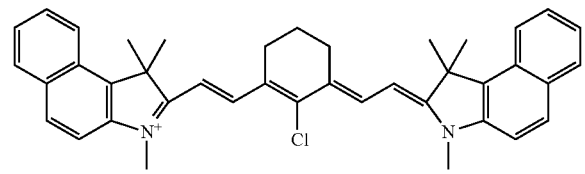

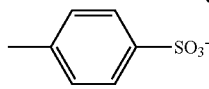

Cyanine dye B

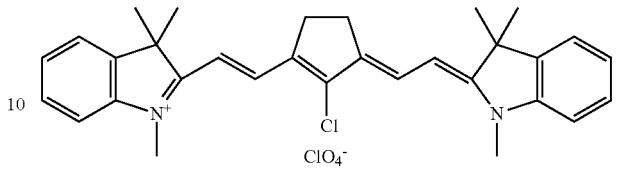

Cyanine dye C

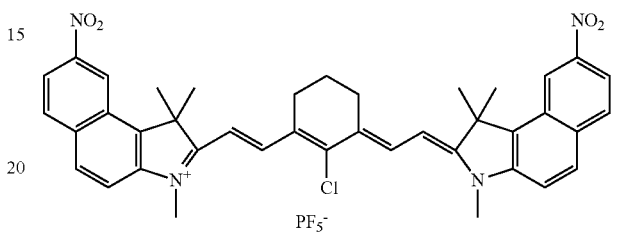

Cyanine dye D

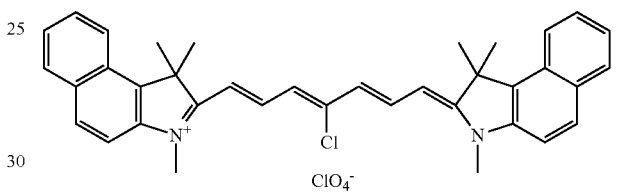

Cyanine dye E

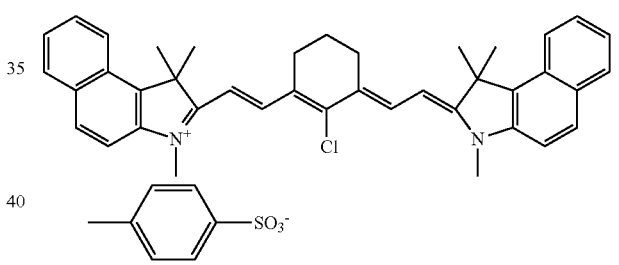

Cyanine dye F

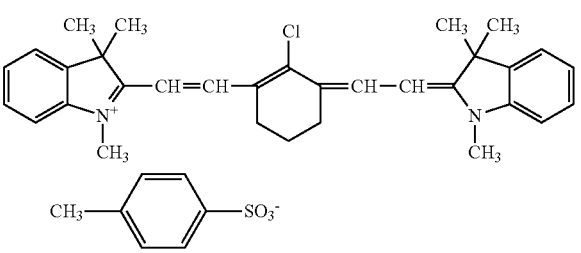

Examples of the pigment include commercial pigments and the pigments as disclosed in Color Index (C.I.) handbook, "Latest Pigment Handbook (Saishin Ganryo Binran)" (edited by Japan Pigment Technical Association, 1977), and "Latest Pigment Applied Technology (Saishin Ganryo Oyo Gijutsu)" (CMC Publishing Co., Ltd., 1986), such as insoluble azo pigments, azo lake pigments, condensed azo pigments, chelate azo pigments, phthalocyanine pigments, anthraquinone pigments, perylene pigments, perinone pigments, thioindigo pigments, quinacridone pigments, dioxazine pigments, isoindolinone pigments, quinophthalone pigments, vat lake pigments, azine pigments, nitroso pigments, nitro pigments, natural pigments, fluorescence pigments, inorganic pigments, and carbon black. Among them, carbon black is preferred.

When the lower layer of the image recording layer contains the infrared ray absorbing agent, the balance between the sensitivity and ablation resistance during image recording is improved.

The amount of the infrared ray absorbing agent to be added is from 0.01% by mass to 50% by mass, preferably from 0.1% by mass to 30% by mass, and particularly preferably from 1.0% by mass to 30% by mass, with respect to the total solid content of the lower layer. When the content is within the ranges, the maximum temperature of the upper layer during image recording is decreased, whereby sufficient sensitivity is achieved with ablation is prevented.

The lower layer of the image recording layer may further contain other additives which will be described later.

(C) Water-Insoluble and Alkali-Soluble Polyurethane Resin

The upper layer of the image recording layer according to the first to third aspects of the invention includes a (C) water-insoluble and alkali-soluble polyurethane resin.

The polyurethane resin contained in the upper layer is not particularly limited as long as it is insoluble in water and soluble in an alkaline aqueous solution. In particular, polyurethane resins having a carboxyl group in the polymer backbone is preferred. Specific examples thereof include a polyurethane resin whose basic skeleton is a reaction product of a diisocyanate compound represented by the following Formula (I) with at least one carboxylic diol compound represented by the following Formula (II) or (III).

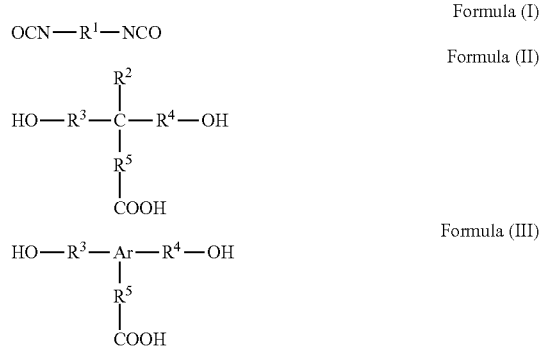

In Formula (I), $R^1$ represents a divalent linking group.

Examples of the divalent linking group represented by $R^1$ include an aliphatic hydrocarbon group, an alicyclic hydrocarbon group, and an aromatic hydrocarbon group. Among them, an alkylene group having 2 to 10 carbon atoms, and an arylene group having 6 to 30 carbon atoms are preferred.

$R^1$ may further have another functional group which is not reactive with an isocyanate group.

In Formula (II), $R^2$ represents a hydrogen atom, a substituted or unsubstituted alkyl group, a substituted or unsubstituted aralkyl group, a substituted or unsubstituted aryl group, a substituted or unsubstituted alkoxy group, or a substituted or unsubstituted aryloxy group.

Preferred examples of $R^2$ include a hydrogen atom, an unsubstituted alkyl group having 1 to 8 carbon atoms, and an unsubstituted aryl group having 6 to 15 carbon atoms.

In Formula (II) or (III), $R^3$, $R^4$, and $R^5$ each represents a single bond or a divalent linking group, and may be the same as or different from each other.

Examples of the divalent linking group represented by $R^3$, $R^4$, or $R^5$ include a substituted or unsubstituted aliphatic hydrocarbon group and a substituted or unsubstituted aromatic hydrocarbon group. $R^3$, $R^4$, and $R^5$ are each preferably an unsubstituted alkylene group having 1 to 20 carbon atoms, or an unsubstituted arylene group having 6 to 15 carbon atoms, and more preferably an unsubstituted alkylene group having 1 to 8 carbon atoms.

$R^3$, $R^4$, and $R^5$ may further have another functional group which is not reactive with an isocyanate group.

In Formula (III), Ar represents a trivalent aromatic hydrocarbon group which may have a substituent, and preferably represents an arylene group having 6 to 15 carbon atoms.

Specific examples of diisocyanate compound represented by Formula (I) include the following compounds, but the present invention is not limited to them:

aromatic diisocyanate compounds such as 2,4-tolylenediisocyanate, 2,4-tolylenediisocyanate dimer, 2,6-tolylenediisocyanate, p-xylylene diisocyanate, metaxylylene diisocyanate, 4,4'-diphenylmethane diisocyanate, 1,5-naphthylene diisocyanate, and 3,3'-dimethylbiphenyl-4,4'-diisocyanate;

aliphatic diisocyanate compounds such as hexamethylene diisocyanate, trimethylhexamethylene diisocyanate, lysine diisocyanate, and dimer acid diisocyanate;

alicyclic diisocyanate compounds such as isophorone diisocyanate, 4,4'-methylene bis(cyclohexylisocyanate), methylcyclohexane-2,4-diisocyanate, methylcyclohexane-2,6-diisocyanate, and 1,3-(isocyanate methyl)cyclohexane; and diisocyanate compounds that is a reaction products between diols and diisocyanates, such as an adduct between 1 mole of 1,3-butylene glycol and 2 moles of tolylene diisocyanate.

Among them, compounds having an aromatic ring such as 4,4'-diphenylmethane diisocyanate, xylylene diisocyanate, and tolylenediisocyanate are preferred from the viewpoint of printing durability.

Specific examples of diol compound having a carboxyl group represented by Formula (II) or (III) include the following compounds, but the present invention is not limited to them:

3,5-dihydroxybenzoic acid, 2,2-bis(hydroxymethyl)propionic acid, 2,2-bis(hydroxyethyl)propionic acid, 2,2-bis(3-hydroxypropyl)propionic acid, 2,2-bis(hydroxymethyl)acetic acid, bis-(4-hydroxy phenyl)acetic acid, 4,4-bis-(4-hydroxyphenyl)pentanoic acid, and tartaric acid.

Among them, 2,2-bis(hydroxymethyl)propionic acid and 2,2-bis(hydroxyethyl)propionic acid are preferred from the viewpoint of reactivity with isocyanate.

The (C) water-insoluble and alkali-soluble polyurethane resin may be synthesized by heating the diisocyanate compound and diol compound in an aprotic solvent in the presence of a known catalyst whose activity is suitable for the reactivity of these components.

The molar ratio between the diisocyanate and the diol compound used herein (i.e., diisocyanate:diol compound) is preferably from 0.8:1 to 1.2:1. When isocyanate groups remain at the polymer ends, a treatment with an alcohol or amine is carried out to produce a final synthesis product having no isocyanate group.

It is preferable that the water-insoluble and alkali-soluble polyurethane resin (C) has an aromatic skeleton from the viewpoint of chemical resistance.

Specific examples of the water-insoluble and alkali-soluble polyurethane resin (C) include reaction products of the following isocyanate compounds and diol compounds. The composition ratio of the isocyanate compounds and diol compounds may be freely selected as long as synthesis of the polyurethane resin is possible and alkali-solubility of the polyurethane resin is maintained.
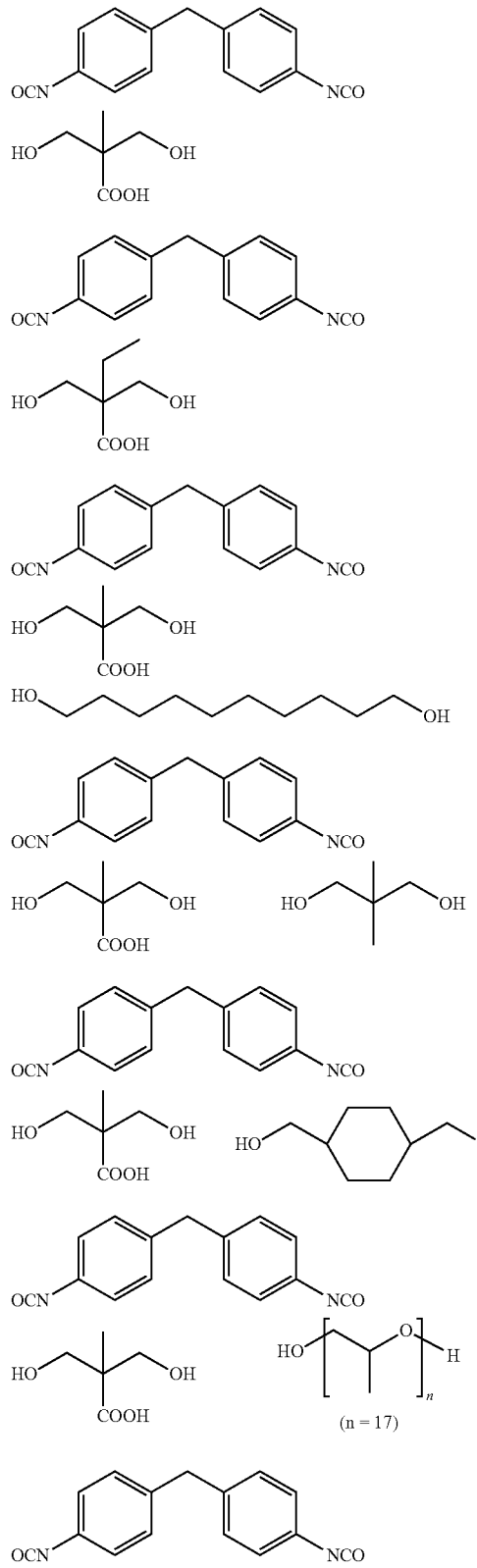
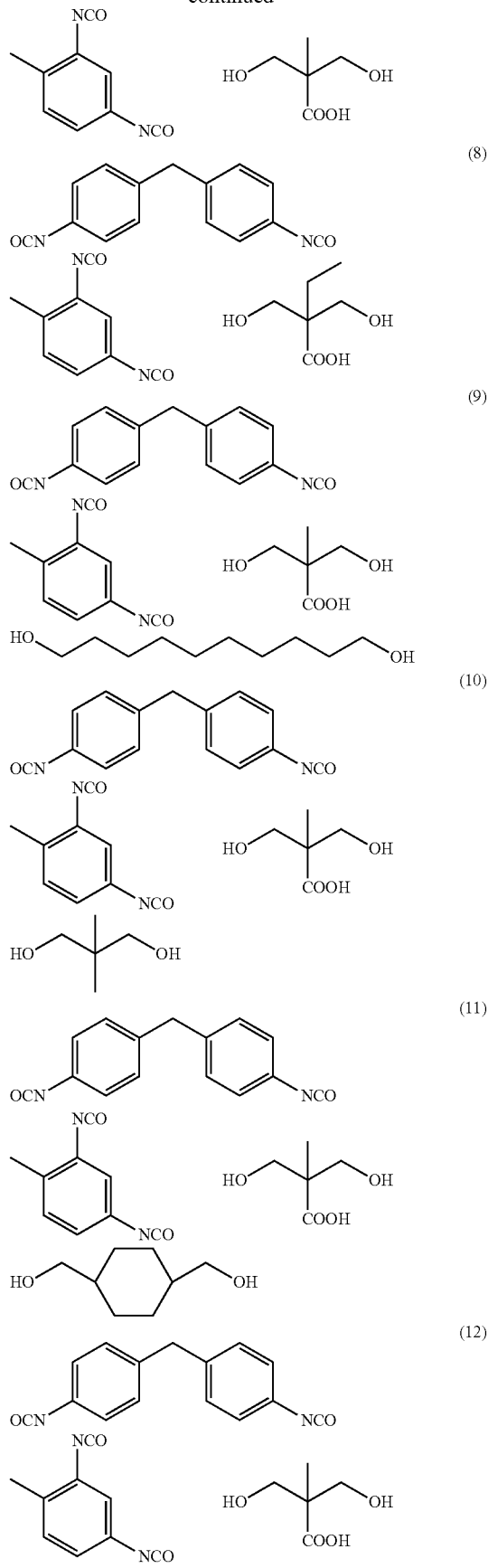

-continued
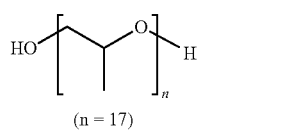
(n = 17)
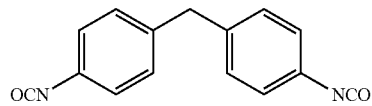
(13)
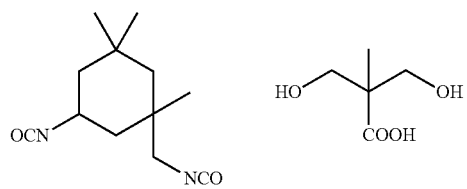
(14)
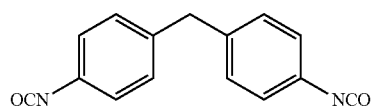
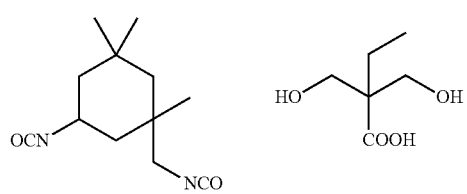
(15)
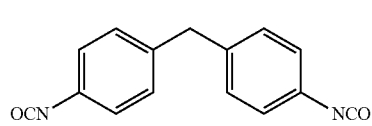
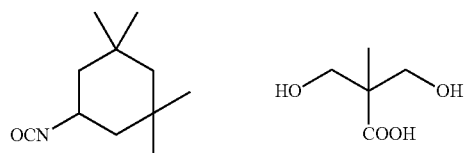
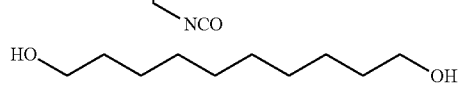
(16)
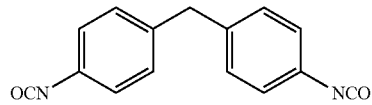
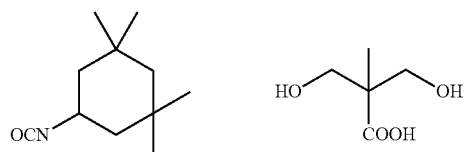
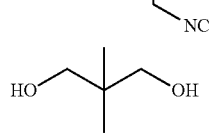
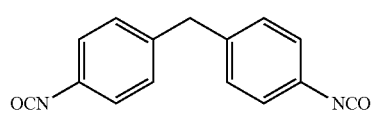
(17)
-continued
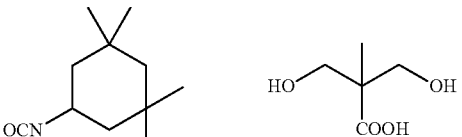
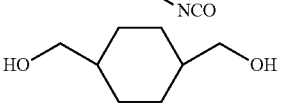
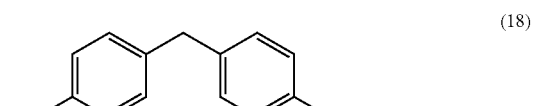
(18)
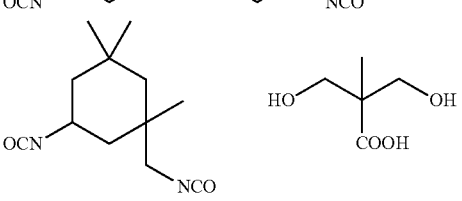
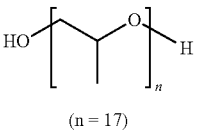
(n = 17)
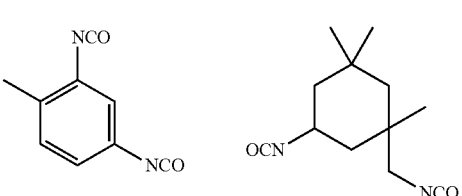
(19)
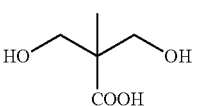
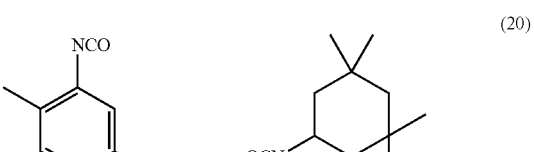
(20)
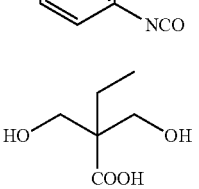
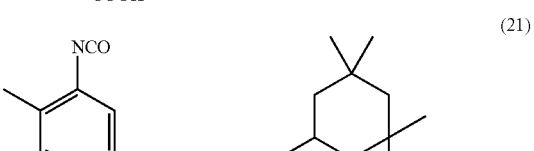
(21)
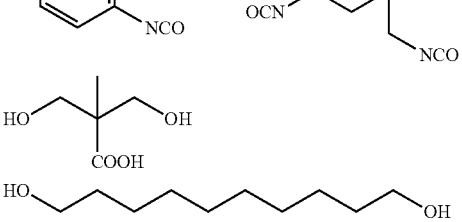

-continued

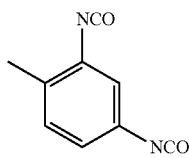
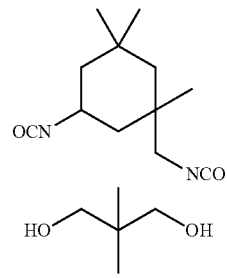
(22)

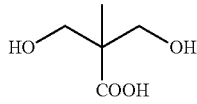

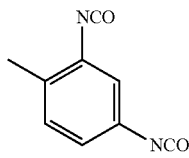
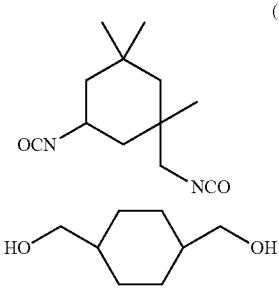
(23)

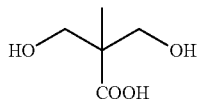

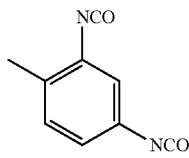
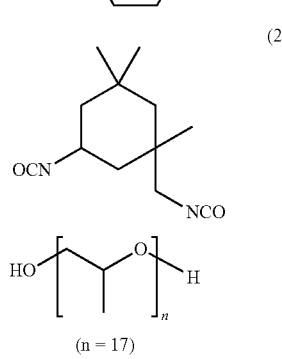
(24)

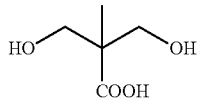
(n = 17)

Among them, specific examples (1), (3), (4), (7), (8), (9), (11), (13), (15), (19), (21), and (22) are particularly preferred.

99.5% by mass, more preferably from 5% by mass to 99% by mass, and particularly preferably from 10% by mass to 98% by mass, with respect to the total solid content of the upper layer. When the content is within the ranges, a good balance is achieved between the preventive effect on the time-dependent generation of development wastes, and image forming ability and printing durability.

(D) Polyorganosiloxane

The upper layer of the image recording layer according to the first to third aspects of the invention contains a (D) polyorganosiloxane.

The (D) polyorganosiloxane is not particularly limited as long as it has a nonpolar moiety containing siloxane, and a polar moiety having an oxygen atom or the like. Examples of the polyorganosiloxane (D) include polyether-modified polyorganosiloxanes, alcohol-modified polyorganosiloxanes, and carboxyl-modified polyorganosiloxanes.

As a specific example of the polyorganosiloxane, a compound obtained by hydrolysis condensation of alkoxysilane in a compound represented by the following Formula (A) is preferred.

$$RSi(OR')_3 \quad (A)$$

In Formula (A), R represents an alkyl group or an aryl group, and R' represents an alkyl group.

In the formula (A), R is preferably a phenyl group; and R' is preferably a methyl group, an ethyl group, or a propyl group, and plural R's may be the same as or different from one another.

Other preferred examples include a graft block polysiloxane represented by the following Formula (a) and a block polysiloxane represented by the following Formula (b).

In Formulae (a) and (b), n, p, and q each independently represent an integer of 1 or more. In Formulae (a) and (b), n preferably represents an integer of from 100 to 800, and more preferably from 150 to 500; p preferably represents an integer of from 10 to 140, and more preferably from 20 to 80; and q preferably represents an integer of from 10 to 100, and more preferably from 15 to 70.

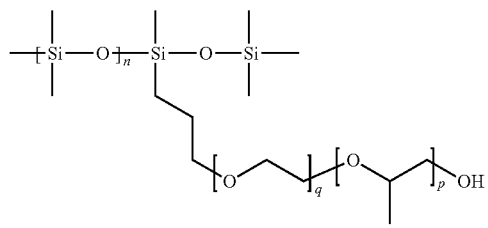
(a)

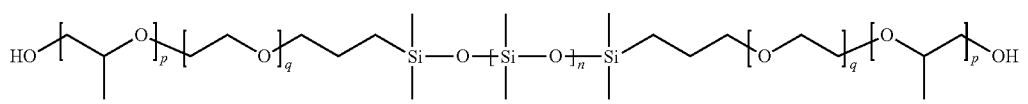
(b)

The water-insoluble and alkali-soluble polyurethane resin (C) has a weight average molecular weight of preferably 1,000 or more, and more preferably from 5,000 to 100,000.

The water-insoluble and alkali-soluble polyurethane resins (C) may be used alone, or in combination of two or more thereof.

The content of the polyurethane resin contained in the upper layer components is preferably from 2% by mass to An example of a method for making an organopolysiloxane resin is specifically described in International Publication No. 2000/035994.

The polyorganosiloxane may be selected from commercial products. Examples of the commercial products include BYK-333 (trade name, manufactured by BYK-Chemie) which is a polyether-modified polydimethylsiloxane, and TEGO GLIDE 410 (trade name, available from Tego Chemie Service GmbH) which is a polysiloxane polyether copolymer.

The content of the polyorganosiloxane (D) in the upper layer of the image recording layer is preferably from 0.01% by mass to 10% by mass, more preferably from 0.03% by mass to 5% by mass, and particularly preferably from 0.1% by mass to 3% by mass, with respect to the total solid content of the upper layer.

When the content of the polyorganosiloxane (D) is within the ranges, the polyorganosiloxane (D) improves scratch resistance owing to its low coefficient of friction, and works as a dispersant to promote the dispersion of the polyurethane resin in the developer, and thus achieves a preventive effect on the time-dependent generation of development wastes.

The upper layer components may further contain another resin, as long as the effect of the invention is not impaired. Since the upper layer itself must exert alkali-solubility particularly in the non-image areas, the additional resin must not impair the alkali-solubility. From this viewpoint, examples of the additional resin include water-insoluble and alkali-soluble resins.

Examples of the water-insoluble and alkali-soluble resin which may be contained in the upper layer include the water-insoluble and alkali-soluble resin (A), which is listed as an essential component of the lower layer. The structure of the water-insoluble and alkali-soluble resin to be included in the upper layer may be the same as or different from the resin included in the lower layer.

The content of the water-insoluble and alkali-soluble resin in the lower layer is preferably 50% by mass or less with respect to the water-insoluble and alkali-soluble polyurethane resin (C).

The upper layer components may further contain an infrared ray absorbing agent, as long as the effect of the invention is not impaired. When an infrared ray absorbing agent is contained in the upper layer, thermal diffusion into a metal substrate having a high thermal conductivity is prevented during exposure, whereby high sensitivity is achieved. The infrared ray absorbing agent which may be contained in the upper layer may be selected from those listed as the infrared ray absorbing agent (B) contained in the lower layer.

Other Components

In the first to third aspects of the invention, the upper layer and lower layer of the image recording layer each may further contain, as necessary, other additional additives.

Examples of the additional components include various additives, such as onium salts, o-quinone diazide compounds, aromatic sulfone compounds, and aromatic sulfonic acid ester compounds, which are pyrolytic substances and substantially deteriorate the solubility of the (A) water-insoluble and alkali-soluble resin when they are undecomposed. The use of these additives improves the preventive effect on the dissolution of the image areas into the developer.

Examples of the onium salts include diazonium salts, ammonium salts, phosphonium salts, iodonium salts, sulfonium salts, selenonium salts, and arsonium salts.

Preferred examples of the onium salts include:

diazonium salts as disclosed in S. I. Schlesinger, Photogr. Sci. Eng., 18, 387 (1974), T. S. Bal et al, Polymer, 21, 423 (1980), and JP-A No. 5-158230;

ammonium salts as disclosed in U.S. Pat. Nos. 4,069,055, 4,069,056, and JP-A No. 3-140140;

phosphonium salts as disclosed in D. C. Necker et al, Macromolecules, 17, 2468 (1984), C. S. Wen et al, Teh, Proc. Conf. Rad. Curing ASIA, p 478 Tokyo, October (1988), and U.S. Pat. Nos. 4,069,055 and 4,069,056;

iodonium salts as disclosed in J. V. Crivello et al, Macromorecules, 10 (6), 1307 (1977), Chem. & amp; Eng. News, November 28, p 31 (1988), European Patent No. 104,143, U.S. Pat. Nos. 339,049, 410,201, and JP-A Nos. 2-150848 and 2-296514;

sulfonium salts as disclosed in J. V. Crivello et al, Polymer J. 17, 73 (1985), J. V. Crivello et al. J. Org. Chem., 43, 3055 (1978), W. R. Watt et al, J. Polymer Sci., Polymer Chem. Ed., 22, 1789 (1984), J. V. Crivello et al, Polymer Bull., 14, 279 (1985), J. V. Crivello et al, Macromorecules, 14 (5), 1141 (1981), J. V. Crivello et al, J. Polymer Sci., PolymerChem. Ed., 17, 2877 (1979), European Patent Nos. 370,693, 233,567, 297,443, and 297,442, U.S. Pat. Nos. 4,933,377, 3,902,114, 410,201, 339,049, 4,760,013, 4,734, 444, and 2,833,827, and German Patent Nos. 2,904,626, 3,604,580, and 3,604,581;

selenonium salts as disclosed in J. V. Crivello et al, Macromorecules, 10 (6), 1307 (1977), J. V. Crivello et al, J. Polymer Sci., and Polymer Chem. Ed., 17, 1047 (1979); and arsonium salts as disclosed in C. S. Wen et al, Teh, Proc. Conf. Rad. Curing ASIA, p 478 Tokyo, October (1988).

Among them, diazonium salts are particularly preferred. The diazonium salts are preferably selected from those described in JP-A No. 5-158230.

Examples of the counter ion of onium salts include tetrafluoroboric acid, hexafluorophosphoric acid, triisopropylnaphthalenesulfonic acid, 5-sulfosalicylic acid, 2,5-dimethylbenzenesulfonic acid, 2,4,6-trimethylbenzenesulfonic acid, 2-nitrobenzenesulfonic acid, 3-bromobenzenesulfonic acid, 2-fluorocaprylnaphthalenesulfonic acid, dodecylbenzenesulfonic acid, 1-naphthol-5-sulfonic acid, 2-methoxy-4-hydroxy-5-benzoyl-benzenesulfonic acid, and paratoluenesulfonic acid. Among them, particularly preferred are alkyl aromatic sulfonic acids such as hexafluorophosphoric acid, triisopropylnaphthalenesulfonic acid, and 2,5-dimethylbenzenesulfonic acid.

The o-quinone diazide compound as used in the invention has one or more o-quinone diazide groups, and whose alkali-solubility increases upon pyrolysis, and may be selected from compounds having various structures. The o-quinone diazide suppresses the dissolution inhibition of the binder upon pyrolysis, and the o-quinone diazide itself turns into an alkali-soluble substance. Therefore, it works as a dissolution promoter for the binder.

The amount of the additive, other than the o-quinone diazide compound, to be added to the upper layer or the lower layer of the image recording layer is preferably from 1% by mass to 50% by mass, more preferably from 5% by mass to 30% by mass, and particularly preferably from 10% by mass to 30% by mass. The additive and binder are preferably contained in the same layer.

In order to additionally improve the sensitivity, additives such as cyclic acid anhydrides, phenols, or organic acids may be added. Examples of the cyclic acid anhydrides include phthalic anhydride, tetrahydrophthalic anhydride, hexahydrophthalic anhydride, maleic acid anhydride, succinic anhydride, pyromellitic dianhydride.

Examples of the phenols include bisphenol A, p-ethoxy phenol, 2,4,4'-trihydroxybenzophenone, 2,3,4-trihydroxybenzophenone, 4-hydroxybenzophenone, 4,4',4"-trihydroxy triphenyl methane, 4,4',3",4"-tetrahydroxy-3,5,3',5'-tetramethyltriphenyl methane.

Examples of the acids include sulfonic acids, sulfinic acids, alkyl sulfuric acids, phosphonic acids, phosphates, and carboxylic acids, and specific examples include p-toluenesulfonic acid, dodecylbenzenesulfonic acid, p-toluene sulfinic acid, ethylsulfuric acid, phenylphosphonic acid, phenylphosphinic acid, phenyl phosphate, diphenyl phosphate, benzoic acid, isophthalic acid, adipic acid, p-toluic acid, 3,4-dimethoxybenzoic acid, phthalic acid, terephthalic acid, 4-cyclohexene-1,2-dicarboxylic acid, erucic acid, lauric acid, n-undecanoic acid, and ascorbic acid.

The proportion of the cyclic acid anhydride, phenol, or organic acid in the upper layer or lower layer of the image recording layer is preferably from 0.05% by mass to 20% by mass, more preferably from 0.1% by mass to 15% by mass, and particularly preferably from 0.1% by mass to 10% by mass.

In order to improve coating properties of the image recording layer, the image recording layer may contain a surfactant such as a fluorine surfactant as disclosed in JP-A No. 62-170950. The content of the surfactant is preferably from 0.01% by mass to 1% by mass, and more preferably from 0.05% by mass to 0.5% by mass, with respect to the coating liquid formulation of the upper and/or lower layer of the image recording layer. Further, in order to attain stability against various development conditions, a nonionic surfactant as disclosed in JP-A Nos. 62-251740 and 3-208514, and an ampholytic surfactant as disclosed in JP-A Nos. 59-121044 and 4-13149 may be added.

Examples of the nonionic surfactant include sorbitan tristearate, sorbitan monopalmitate, sorbitan trioleate, monoglyceride stearate, and polyoxyethylene nonyl phenyl ether. Examples of the ampholytic surfactant include alkyldi(aminoethyl)glycine, alkylpolyaminoethyl glycine hydrochloride, 2-alkyl-N-carboxyethyl-N-hydroxyethyl imidazolinium betaine, and N-tetradecyl-N,N-betaine.

The content of the nonionic surfactant and/or ampholytic surfactant is preferably from 0.05% by mass to 15% by mass, and more preferably from 0.1% by mass to 5% by mass, with respect to the coating liquid formulation of the upper and/or lower layer of the image recording layer.

The image recording layer may further contain a printing-out agent for obtaining a visible image immediately after heating by exposure, and a dye or pigment as an image coloring agent. Typical examples of the printing-out agent include a combination of a compound (photo-acid generating agent) which releases an acid when heated by exposure and an organic dye which is able to form a salt with the compound. Specifically, combinations of o-naphthoquinone diazide-4-sulfonic acid halogenide and organic dyes which is able to form a salt therewith, as disclosed in JP-A Nos. 50-36209 and 53-8128, and combinations of trihalomethyl compounds and organic dyes which is able to form a salt therewith, as disclosed in JP-A Nos. 53-36223, 54-74728, 60-3626, 61-143748, 61-151644, and 63-58440. The trihalomethyl compounds include oxazole compounds and triazine compounds, and both of them achieve good temporal stability, and provide clear print-out images.

The coloring agent used for improving the visibility of the image areas may be selected from various dyes. Preferred examples of the dye include oil-soluble dyes and basic dyes. Specific examples thereof include brilliant green, OIL GREEN BG, OIL BLUE BOS, OIL BLUE #603, OIL BLACK BY, OIL BLACK BS, OIL BLACK T-505 (trade names, manufactured by Orient Chemical Industries, Co., Ltd.), victoria pure blue, crystal violet (C.I. 42555), methyl violet (C.I. 42535), ethyl violet, rhodamine B (C.I. 145170B), malachite green (C.I. 42000), and methylene blue (C.I. 52015). The dyes as disclosed in JP-A No. 62-293247 are particularly preferred.

The content of the dyes is preferably from 0.01% by mass to 10% by mass, and more preferably from 0.1% by mass to 3% by mass, with respect to the total solid content of the upper and/or lower layer of the image recording layer.

The upper and/or lower layer of the image recording layer may further contain, as necessary, a plasticizing agent for imparting flexibility or the like to the image recording layer. Examples of the plasticizing agent include butyl phthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, and oligomers and polymers of acrylic acid or methacrylic acid.

Formation of Planographic Printing Plate Precursor

A positive-working planographic printing plate precursor used in the making method according to the first to third aspects of the invention is formed by applying, on a support described below, an image recording layer coating liquid for forming a lower layer, which has been prepared by dissolving the components of the lower layer in a solvent, and then applying thereon an image recording layer coating liquid for forming an upper layer, which has been prepared by dissolving the components of the upper layer in a solvent, in this order.

Support

In the first to third aspects of the invention, the support used for producing a planographic printing plate precursor is preferably a dimensionally-stable plate or sheet. Examples of the support include paper, plastic-laminated paper, metal sheets (for example, metal sheets made from aluminum or copper), plastic films (for example, plastic films made from cellulose triacetate, cellulose propionate, cellulose butyrate, cellulose acetate butyrate, polyethylene terephthalate, polystyrene, polypropylene, polycarbonate, or polyvinyl acetal), and paper or plastic films on which the metal has been laminated or deposited.

Among them, aluminum plates are particularly preferred owing to their good dimensional stability and relatively low cost. Preferred aluminum plates are pure aluminum plates and aluminum alloy plates composed mainly of aluminum and containing a trace amount of different elements. Examples of the different elements contained in the aluminum alloys include silicon, iron, manganese, copper, magnesium, chromium, zinc, bismuth, nickel, and titanium. The content of the different elements in total in an alloy is, at most, 10% by mass or less. The thickness of the aluminum plate is preferably about 0.1 mm to about 0.6 mm, more preferably from 0.15 mm to 0.4 mm, and particularly preferably from 0.2 mm to 0.3 mm.

The aluminum plate may be subjected to various kinds of surface treatments such as roughening and anodic oxidation treatment.

Before roughening, an aluminum plate is subjected to, as necessary, a degreasing treatment using, for example, a surfactant, an organic solvent, or an aqueous alkaline solution thereby removing a rolling oil from the surface. The surface roughening treatment for an aluminum plate may be carried out by any one of various methods, such as a method of mechanically roughening the surface, a method of electrochemically dissolving and roughening the surface, or a method of chemically and selectively dissolving the surface. The mechanical method may be selected from known methods such as a ball polishing method, a brush polishing method, a blast polishing method, or a buff polishing method. The electrochemical roughening method may be carried out using an alternating or direct current in a hydrochloric acid or nitric acid electrolytic solution. Alternatively, as disclosed in JP-A No. 54-63902, a combination of these methods may be used.

The aluminum plate having a roughened surface is subjected to, as necessary, an alkali etching treatment and a neutralization treatment, and then, as necessary, an anodic oxidation treatment to improve the water retentivity and abrasion resistance of the surface. The electrolyte used for the anodic oxidation treatment of an aluminum plate may be selected from various electrolytes which enables formation of a porous oxide film, and is commonly sulfuric acid, phosphoric acid, oxalic acid, or a mixture of these acids. The electrolyte concentration is appropriately selected according to the type of the electrolyte.

The conditions for the anodic oxidation treatment are not specifically defined, because the conditions may vary depending on the electrolyte. In general, it is preferred that the electrolyte concentration be from 1% by mass to 80% by mass, the liquid temperature be from 5° C. to 70° C., the current density be from 5 to 60 A/dm$^2$, the voltage be from 1 to 100 V, and the electrolysis time be from 10 seconds to 5 minutes. The amount of an anode oxide film formed by the anodic oxidation is preferably 1.0 g/m$^2$ or more. When the amount of the anode oxide film is less than 1.0 g/m$^2$, the printing durability may be insufficient, or the non-image areas of the planographic printing plate are susceptible to scratches, which may result in blemishes caused by ink adhesion to the scratches during printing.

After the anodic oxidation treatment, the surface of the aluminum plate is subjected to, as necessary, a hydrophilizing treatment. Examples of the method of the hydrophilizing treatment include a method using an alkali metal silicate (for example, sodium silicate aqueous solution) as disclosed in U.S. Pat. Nos. 2,714,066, 3,181,461, 3,280,734, and 3,902,734. In this method, the support is immersed or electrolyzed in a sodium silicate aqueous solution. Other examples include a method of treating with potassium fluorozirconate as disclosed in JP-B No. 36-22063, and a method of treating with polyvinylphosphonic acid as disclosed in U.S. Pat. Nos. 3,276,868, 4,153,461, and 4,689,272.

The solvent is not particularly limited, and may be selected from known solvents such as ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxy ethane, methyl lactate, ethyl lactate, N,N-dimethylacetamide, N,N-dimethylformamide, tetramethylurea, N-methylpyrrolidone, dimethyl sulfoxide, sulfolane, γ-butyrolactone, or toluene. These solvents may be used alone, or in combination of two or more thereof.

Regarding the concentration of the components (total solid contents including additives) of an image recording layer coating liquid for forming an upper or lower layer in the solvent, the concentration of the components of an image recording layer coating liquid for forming a lower layer in the solvent is preferably from 1% by mass to 50% by mass, and the concentration of the components of an image recording layer coating liquid for forming an upper layer in the solvent is from 1% by mass to 50% by mass.

Regarding the coating weight of the image recording layer of the planographic printing plate precursor according to the first to third aspects of the invention, the coating weight of a lower layer (or a lower image recording layer) provided nearer to the support is preferably from 0.5 g/m$^2$ to 1.5 g/m$^2$, and more preferably from 0.7 g/m$^2$ to 1.2 g/m$^2$ after drying, from the viewpoints of ensuring sufficient printing durability and preventing the generation of film wastes during development.

The coating weight of an upper layer (or an upper image recording layer) is preferably from 0.05 g/m$^2$ to 1.0 g/m$^2$, and more preferably from 0.07 g/m$^2$ to 1.0 g/m$^2$ after drying.

As the coating weight decreases, the apparent sensitivity increases, but the film properties of the image recording layer deteriorate.

The method for applying an upper image recording layers or a lower image recording layer is not particularly limited, and may be selected from known coating methods such as bar coater coating, rotary coating, spray coating, curtain coating, dip coating, air knife coating, blade coating, and roll coating.

In the planographic printing plate precursor according to the first to third aspects of the invention, an undercoat layer may be provided, as necessary, between the support and the lower layer of the image recording layer (i.e., the lower image recording layer).

The component of the undercoat layer may be selected from various organic compounds, and examples thereof include carboxymethyl cellulose, dextrin, gum arabic, aminophosphonic acids such as 2-aminoethylphosphonic acid, organic phosphonic acids such as phenylphosphonic acid which may have a substituent, naphthylphosphonic acid which may have a substituent, alkylphosphonic acid which may have a substituent, glycerophosphonic acid which may have a substituent, methylenediphosphonic acid which may have a substituent, or ethylenediphosphonic acid which may have a substituent, organophosphorus acids such as phenylphosphoric acid which may have a substituent, naphthylphosphoric acid which may have a substituent, alkylphosphoric acid which may have a substituent, or glycerophosphoric acid which may have a substituent, organic phosphinic acids such as phenylphosphinic acid which may have a substituent, naphthylphosphinic acid which may have a substituent, alkylphosphinic acid which may have a substituent, or glycerophosphinic acid which may have a substituent, amino acids such as glycine and β-alanine, and hydroxylic amine hydrochlorides such as triethanolamine hydrochloride. These compounds may be used alone, or in combination of two or more thereof.

The undercoat layer may be formed by the following method.

Specifically, an undercoat layer may be formed by a method in which: any of the above organic compounds is dissolved in water or an organic solvent such as methanol, ethanol, or methyl ethyl ketone, or a mixture of these solvents to make a solution, and the solution is applied to an aluminum plate, and dried. Alternatively, an undercoat layer may be formed by a method in which: any of the above organic compounds is dissolved in water or an organic solvent such as methanol, ethanol, or methyl ethyl ketone, or a mixture of these solvents to make a solution, and an aluminum plate is immersed in the solution to adsorb the compound, followed by water washing, and drying.

In the former method, the concentration of the organic compound in its solution is preferably from 0.005% by mass to 10% by mass. In the latter method, the concentration of the organic compound in its solution is preferably from 0.01% by mass to 20% by mass, and more preferably from 0.05% by mass to 5% by mass; the immersion temperature is preferably from 20 to 90° C., and more preferably from 25 to 50° C.; and the immersion time is preferably from 0.1 seconds to 20 minutes, and more preferably from 2 seconds to 1 minute.

The solution in which the organic compound is dissolved may contain a basic substance such as ammonia, triethylamine, or potassium hydroxide, or an acidic substance such as hydrochloric acid or phosphoric acid, to adjust the pH thereof in the range of from 1 to 12. The solution may further contain a yellow dye to improve the tone reproducibility of the image forming material.

The coating weight of the organic undercoat layer is preferably from 2 mg/m$^2$ to 200 mg/m$^2$, and more preferably from 5 mg/m$^2$ to 100 mg/m$^2$, from the viewpoint of achieving sufficient printing durability. When the coating weight is within the ranges, sufficient printing durability is achieved.

In the planographic printing plate precursor according to the first to third aspects of the invention, as necessary, an overcoat may be provided on the upper layer of the image recording layer.

The component of the overcoat layer is preferably an alkali-soluble polyurethane resin, and particularly preferably a polyurethane resin having a carboxyl group in the polymer backbone, which is a reaction product between an isocyanate compound and a diol compound having a carboxyl group. The isocyanate used for producing the above-described polyurethane resin is preferably an aromatic diisocyanate such as tolylene diisocyanate, and the diol used for producing the above-described polyurethane resin is preferably 3,5-dihydroxybenzoic acid or 2,2-bis(hydroxymethyl)propionic acid.

As described above, the planographic printing plate precursor used in the making method according to the first to third aspects of the invention is obtained.

Method for Making Planographic Printing Plate

In the making method according to the first aspect of the invention, a planographic printing plate is made through an exposure step in which the planographic printing plate precursor, which has been obtained as described above, is subjected to image-wise exposure (hereinafter may be referred simply to as "exposure step"), and a development step in which the planographic printing plate precursor after image-wise exposure is developed using an alkaline aqueous solution (i.e., a specific developer according to the first aspect) which contains a nonionic surfactant and has a pH of from 8.5 to 10.8 (hereinafter may be referred simply to as "development step").

In the making method according to the second aspect of the invention, a planographic printing plate is made through an exposure step in which the planographic printing plate precursor, which has been obtained as described above, is subjected to image-wise exposure (hereinafter may be referred simply to as "exposure step"), and a development step in which the planographic printing plate precursor after image-wise exposure is developed using an alkaline aqueous solution (i.e., a specific developer according to the second aspect) which contains at least one of a compound represented by Formula (1) and a compound represented by Formula (2) and has a pH of from 8.5 to 10.8 (hereinafter may be referred simply to as "development step").

In the making method according to the third aspect of the invention, the planographic printing plate precursor, which has been obtained as described above, is usually subjected to image-wise exposure and development treatment, whereby a planographic printing plate is made.

More specifically, according to the first to third aspects of the invention, the planographic printing plate precursor subjected to the desired image-wise exposure in the exposure step has improved solubility in the exposed regions for an alkaline developer, and the exposed regions are removed by the development in the development step using the specific developer according to the first to third aspects to form non-image areas. As a result, the residual unexposed areas of the image recording layer become the image areas of the planographic printing plate.

Exposure Step

Hereinbelow, the exposure step in the method for making a planographic printing plate according to the first to third aspects of the invention is further described.

Examples of the light source of active light used for exposure include mercury lamps, metal halide lamps, xenon lamps, chemical lamps, and carbon arc lamps. Examples of the radiation include electron beams, X rays, ion beams, and far infrared rays. Other examples include g-lines, i-lines, Deep-UV light, and high density energy beams (laser beams). Examples of the laser beams include helium neon lasers, argon lasers, krypton lasers, helium-cadmium lasers, and KrF excimer lasers.

The image-wise exposure may be carried out by exposure through a mask such as a lith film, or by scanning exposure.

In the invention, the light source preferably has an emission wavelength in the range from near infrared to infrared region, and is particularly preferably a solid laser or a semiconductor laser.

Development Step

Hereinbelow, the development step according to the first to third aspects of the invention is further described.

Specific Developer According to First Aspect

First, the specific developer according to the first aspect of the invention is described.

A process liquid used for the development step according to the first aspect (i.e., a specific developer according to the first aspect) is an alkaline aqueous solution which contains a nonionic surfactant and has a pH of from 8.5 to 10.8.

Nonionic Surfactant

The specific developer according to the first aspect contains a nonionic surfactant. The nonionic surfactant contributes to the improvement of processability.

The nonionic surfactant used in the first aspect is further described below.

Examples of the nonionic surfactant used in the first aspect include higher alcohol ethylene oxide adducts of polyethylene glycol, alkylphenol ethylene oxide adducts, polyethylene glycol adducts of aromatic compounds, fatty acid ethylene oxide adducts, polyhydric alcohol fatty acid ester ethylene oxide adducts, higher alkylamine ethylene oxide adducts, fatty acid amide ethylene oxide adducts, ethylene oxide adducts of oil and fat, polypropylene glycol ethylene oxide adducts, dimethylsiloxane-ethylene oxide block copolymers, dimethylsiloxane-(propylene oxide-ethylene oxide) block copolymers, fatty acid esters of polyhydric alcohol glycerol, fatty acid esters of pentaerythritol, fatty acid esters of sorbitol and sorbitan, fatty acid esters of sucrose, alkyl ethers of polyhydric alcohols, and fatty acid amides of alkanolamines.

Particularly preferred examples of the nonionic surfactant include nonionic aromatic ether surfactants represented by the following Formulae (1-A) and (1-B).

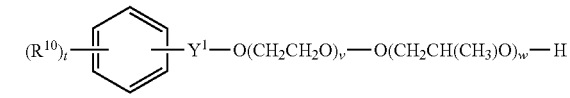

(1-A)

(1-B)

In Formulae (1-A) and (1-B), $R^{10}$ and $R^{20}$ each represent a hydrogen atom or an organic group having 1 to 100 carbon atoms; t and u each represent 1 or 2; $Y^1$ and $Y^2$ each represent a single bond or an alkylene group having 1 to 10 carbon atoms; v and w each represent 0 or an integer of 1 to 100, wherein v and w both do not represent 0 at the same time, and when v or w is 0, the remainder of v and w is not 1; v' and w' each represent 0 or an integer of 1 to 100, wherein v' and w' both do not represent 0 at the same time, and when v' or w' is 0, the remainder of v' and w' is not 1.

In Formula (1-A), when t represents 2, and $R^{10}$ represents an organic group having 1 to 100 carbon atoms, two $R^{10}$'s may be the same as or different from each other, and two $R^{10}$'s may be bonded to each other to form a ring.

In Formula (1-B), when u represents 2, and $R^{20}$ represents an organic group having 1 to 100 carbon atoms, two $R^{20}$'s may be the same as or different from each other, and two $R^{20}$'s may be bonded to each other to form a ring.

Specific examples of the organic group having 1 to 100 carbon atoms, which is represented by $R^{10}$ or $R^{20}$, include saturated or unsaturated, and linear or branched aliphatic hydrocarbon groups, and aromatic hydrocarbon groups, such as an alkyl group, an alkenyl group, an alkynyl group, an aryl group, or an aralkyl group.

Preferred examples of $R^{10}$ and $R^{20}$ include a hydrogen atom, a linear or branched alkyl group having 1 to 10 carbon atoms, an alkoxy group having 1 to 10 carbon atoms, an alkoxycarbonyl group, a N-alkylamino group, a N,N-dialkylamino group, a N-alkylcarbamoyl group, an acyloxy group, an acylamino group, a polyoxyalkylene chain having about 5 to 20 repeating units, an aryl group having 6 to 20 carbon atoms, and an aryl group having a polyoxyalkylene chain having about 5 to 20 repeating units bonded thereto.

In the compounds represented by Formulae (1-A) or (1-B), the number of the repeating units of polyoxyethylene chains is preferably from 3 to 50, and more preferably from 5 to 30. The number of the repeating units of polyoxypropylene chains is preferably from 0 to 10, and more preferably from 0 to 5. The arrangement of the polyoxyethylene and polyoxypropylene units may be random or block.

Examples of the compound represented by Formula (1-A) include polyoxyethylene phenyl ether, polyoxyethylene methylphenyl ether, polyoxyethylene octyl phenyl ether, and polyoxyethylene nonyl phenyl ether.

Examples of the compound represented by Formula (1-B) include polyoxyethylene naphthyl ether, polyoxyethylene methyl naphthyl ether, polyoxyethylene octyl naphthyl ether, and polyoxyethylene nonyl naphthyl ether.

Specific examples of the nonionic surfactant including the nonionic aromatic ether surfactant represented by Formula (1-A) or (1-B) are shown below, but the invention is not limited to them.

Y-1

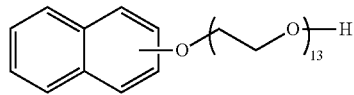

Y-2

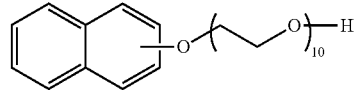

Y-3

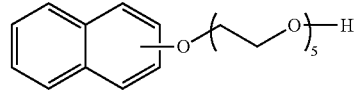

Y-4

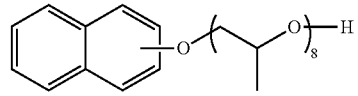

Y-5

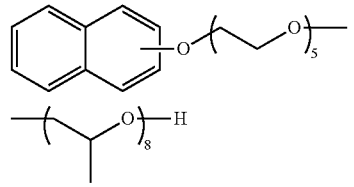

Y-6

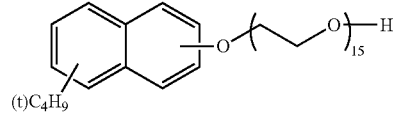

Y-7

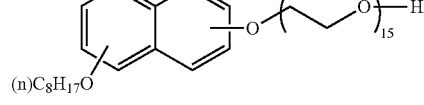

Y-8

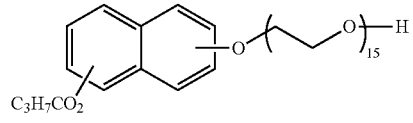

Y-9

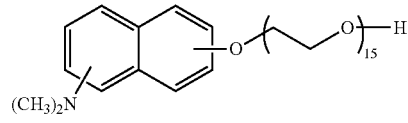

Y-10

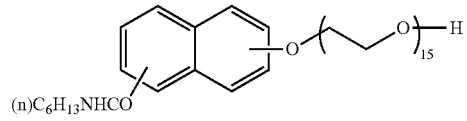

Y-11

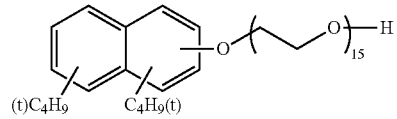

Y-12

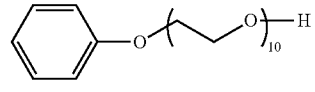

Y-13

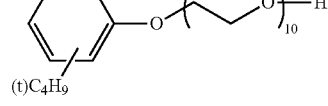

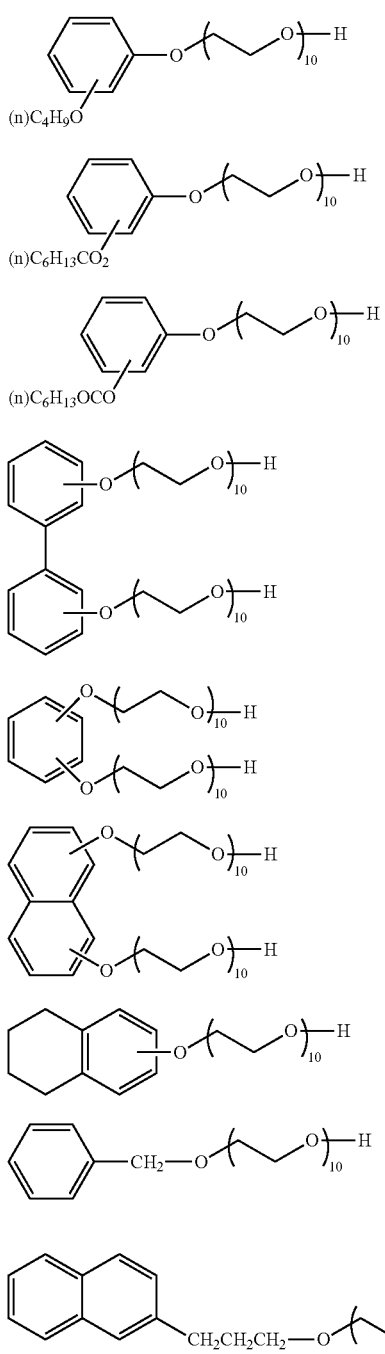

Examples of the nonionic surfactant used in the first aspect of the invention, other than the nonionic aromatic ether surfactants, include ethylene oxide adducts of sorbitol and/or sorbitan fatty acid esters, polypropylene glycol ethylene oxide adducts, dimethylsiloxane-ethylene oxide block copolymers, dimethylsiloxane-(propylene oxide-ethylene oxide) block copolymers, and fatty acid esters of polyhydric alcohols.

From the viewpoint of stable solubility or turbidity in water, the nonionic surfactant has an HLB (Hydrophile-Lipophile Balance) value of preferably 6 or more, and more preferably 8 or more.

As the nonionic surfactant, other surfactants such as oxyethylene adducts of acetylene glycols and acetylene alcohols, fluorine surfactants, or silicon surfactants also may be used.

The nonionic surfactant may be selected from commercial products. Examples of the commercial products include NEWCOL 703, 704, 706, 707, 708, 709, 710, 711, 712, 714, 719, 723, 729, 733, 740, 747, 780, 610, 2604, 2607, 2609, and 2614 (polyoxyethylene polycyclic phenyl ethers, trade names, manufactured by Nippon Nyukazai Co., Ltd.), NEWCOL 707-F, 710-F, 714-F, 2608-F, 2600-FB, 2616-F, and 3612-FA (polyoxyalkylene polycyclic phenyl ethers, trade names, manufactured by Nippon Nyukazai Co., Ltd.), NEWCOL B10 and B13 (polyoxyethylene aryl ethers, trade names, manufactured by Nippon Nyukazai Co., Ltd.), NEWCOL BNF5-M and BN-F6 (polyoxyalkylene aryl ethers, trade names, manufactured by Nippon Nyukazai Co., Ltd.), ELEMINOL HA-100 and HA-161, NONIPOL 100, 110, 120, 130, 140, 160, 200, 300, 400, 500, and 700, and OCTAPOL 100, 110, 140, 184, 200, 300, and 400 (polyoxyethylene phenyl ethers, trade names, manufactured by Sanyo Chemical Industries, Ltd.).

In the specific developer according to the first aspect, the nonionic surfactants may be used alone, or in combination of two or more thereof.

The content of the nonionic surfactant such as a nonionic aromatic ether surfactant in a specific developer is preferably from 1% by mass to 20% by mass, and more preferably from 2% by mass to 10% by mass, with respect to the total mass of the specific developer. When the addition amount of the nonionic surfactant is within the ranges, develop ability, solubility of the photosensitive layer components, and printing durability of the printing plate are further improved.

Other Surfactant

The specific developer according to the first aspect of the invention may further contain, in addition to the nonionic surfactant, an anionic surfactant, a cationic surfactant, or an ampholytic surfactant, as long as the effect of the invention is not impaired.

Examples of the anionic surfactant include fatty acid salts, abietic acid salts, hydroxyalkane sulfonates, alkane sulfonates, dialkyl sulfosuccinates, linear alkylbenzene sulfonates, branched alkylbenzene sulfonates, alkyl naphthalene sulfonates, alkyl phenoxy polyoxyethylene propyl sulfonates, polyoxyethylene alkyl sulfophenyl ether salts, N-methyl-N-oleyl taurine sodiums, N-alkylsulfosuccinic acid monoamide disodium salts, petroleum sulfonates, sulfated castor oil, sulfated beef tallow oil, sulfates of fatty acid alkyl esters, alkyl sulfate salts, polyoxyethylene alkyl ether sulfate salts, fatty acid monoglyceride sulfate salts, polyoxyethylene alkylphenyl ether sulfate salts, polyoxyethylene styryl phenyl ether sulfate salts, alkyl phosphate salts, polyoxyethylene alkyl ether phosphate salts, polyoxyethylene alkyl phenyl ether phosphate salts, partially saponified styrene-maleic acid anhydride copolymers, partially saponified olefin-maleic acid anhydride copolymers, naphthalene sulfonate formalin condensates, aromatic sulfonates, and aromatic substituted polyoxyethylene sulfonates. Among them, dialkyl sulfosuccinates, alkyl sulfate salts, and alkyl naphthalene sulfonates are particularly preferred.

Examples of the cationic surfactant include alkylamine salts, quaternary ammonium salts, polyoxyethylene alkyl amine salts, and polyethylene polyamine derivatives.

Examples of the ampholytic surfactant include amino acid ampholytic surfactants, betaine ampholytic surfactants, and amine oxide ampholytic surfactants. The number of total carbon atoms of the ampholytic surfactant may be influenced by the components of the photosensitive layer, in particular the binder polymer. The number of total carbon atoms of the ampholytic surfactant is preferably relatively smaller when a binder polymer having a high hydrophilicity is used, and is preferably relatively larger when a binder polymer having a low hydrophilicity is used.

In the first aspect, the content of other surfactants in the specific developer is preferably from 0.01% by mass to 10% by mass, and more preferably from 0.01% by mass to 5% by mass.

Next, the developer according to the second aspect of the invention is further described.

Specific Developer According to Second Aspect

A process liquid used in the development step according to the second aspect of the invention (i.e., a specific developer according to the second aspect) is an alkaline aqueous solution which contains at least one of a compound represented by the following Formula (1) and a compound represented by the following Formula (2), and has a pH of 8.5 to 10.8.

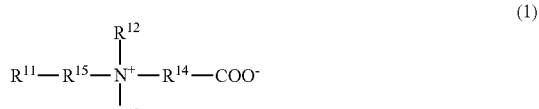

In Formula (1), $R^{11}$, $R^{12}$, and $R^{13}$ each independently represent an alkyl group; $R^{14}$ represents an alkylene group; and $R^{15}$ represents a single bond or a divalent linking group containing a hetero atom.

In Formula (2), $R^{21}$, $R^{22}$, and $R^{23}$ each independently represent an alkyl group.

The compounds represented by Formulae (1) and (2) are compounds which work as betaine ampholytic surfactants, and contribute to the improvement of processability.

Formulae (1) and (2) are further described below.

In Formula (1), the alkyl group represented by $R^{11}$, $R^{12}$, or $R^{13}$ may be linear or branched, and may further have a substituent.

The alkyl group represented by $R^{11}$ is preferably an alkyl group having 4 to 22 carbon atoms, more preferably an alkyl group having 6 to 20 carbon atoms, and even more preferably an alkyl group having 6 to 18 carbon atoms.

The alkyl group expressed by $R^{12}$ or $R^{13}$ is preferably an alkyl group having 1 to 8 carbon atoms, more preferably an alkyl group having 1 to 4 carbon atoms, and even more preferably an alkyl group having one carbon atom (i.e., a methyl group).

$R^{15}$ which links $R^{11}$ to a quaternary nitrogen cation represents a single bond or a divalent linking group containing a hetero atom. The divalent linking group is preferably a divalent linking group having an ester bond, an amide bond, or an ether bond adjacent to $R^{11}$, and is more preferably a divalent linking group containing an ester bond, an amide bond, or an ether bond adjacent to $R^{11}$, and an alkylene chain having 1 to 8 carbon atoms (preferably 1 to 3 carbon atoms).

In Formula (1), the alkylene group represented by $R^{14}$ may be linear or branched, and may further have a substituent.

The alkylene group represented by $R^{14}$ is preferably an alkylene group having 1 to 9 carbon atoms, more preferably an alkylene group having 1 to 6 carbon atoms, and even more preferably an alkylene group having 1 to 3 carbon atoms.

In the alkylene group represented by $R^{14}$, one or more of the carbon atoms composing the alkylene chain may be replaced with a divalent linking group containing a hetero atom, such as an ester bond, an amide bond, or an ether bond.

Preferred examples of the substituent which may be introduced to $R^{11}$, $R^{12}$, $R^{13}$, $R^{14}$, or $R^{15}$ include a hydroxyl group, an ethylene oxide group, a phenyl group, an amide group, and a halogen atom.

At least two of $R^{11}$, $R^{12}$, and $R^{13}$ may be linked together to form a ring. The ring is preferably a five-membered or six-membered ring, and the ring is particularly preferably a heterocycle containing a hetero atom. The hetero atom is preferably an oxygen atom, a nitrogen atom, or a sulfur atom. It is particularly preferred that the ring has a cation structure such as a substituted imidazole ring, a substituted imidazoline ring, or a substituted imidazolidine.

In the compound represented by Formula (1), the number of total carbon atoms of $R^{11}$, $R^{12}$, $R^{13}$, $R^{14}$, and $R^{15}$ is preferably from 8 to 25, and more preferably from 11 to 21, from the viewpoint of solubility of the compound in a developer.

In Formula (2), the alkyl group represented by $R^{21}$, $R^{22}$, or $R^{23}$ may be linear or branched, and may further have a substituent.

The alkyl group represented by $R^{21}$ is preferably an alkyl group having 9 to 22 carbon atoms, more preferably an alkyl group having 9 to 18 carbon atoms, and even more preferably an alkyl group having 12 to 14 carbon atoms.

The alkyl group represented by $R^{22}$ or $R^{23}$ is preferably an alkyl group having 1 to 8 carbon atoms, more preferably an alkyl group having 1 to 4 carbon atoms, and even more preferably an alkyl group having one carbon atom (i.e., a methyl group). It is more preferred that the alkyl groups represented by $R^{22}$ and $R^{23}$ be the same alkyl groups.

In the alkyl group represented by $R^{21}$, $R^{22}$, or $R^{23}$, one or more of the carbon atoms composing the alkyl chain may be replaced with a divalent linking group containing a hetero atom, such as an ester bond, an amide bond, or an ether bond.

Preferred examples of the substituent which may be introduced to $R^{21}$, $R^{22}$, or $R^{23}$ include a hydroxyl group, an ethylene oxide group, a phenyl group, an amide group, and a halogen atom.

In the compound represented by Formula (2), the number of total carbon atoms of $R^{21}$, $R^{22}$, and $R^{23}$ is preferably from 8 to 22, and more preferably from 10 to 20, from the viewpoint of solubility of the compound in a developer.

In the compounds represented by Formulae (1) and (2), the number of total carbon atoms is preferably relatively smaller when the image recording layer to be developed contains a binder polymer having a high hydrophilicity, and is preferably relatively larger when the image recording layer contains a binder polymer having a low hydrophilicity.

Preferred specific examples of the compounds represented by Formulae (1) and (2) are shown below, but the invention is not limited to them.

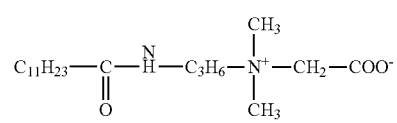

-continued

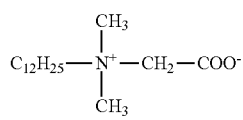
W-2

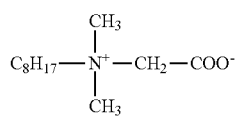
W-3

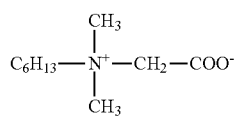
W-4

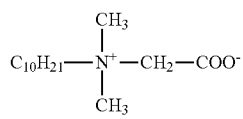
W-5

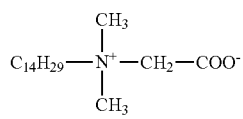
W-6

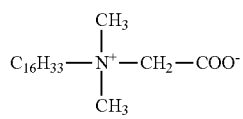
W-7

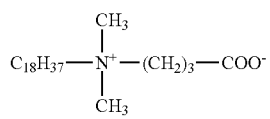
W-8

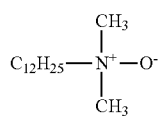
W-9

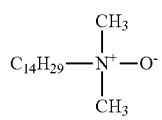
W-10

The compounds represented by Formulae (1) and (2) may be used alone, or in combination of two or more thereof.

The compounds represented by Formulae (1) and (2) may be selected from commercial products.

Examples of the commercial product of the compound represented by Formula (1) include PIONIN C 157K, TAKESURF C-157-L (trade names, manufactured by Takemoto Oil & Fat Co., Ltd.), REBON 2000, REBON LD36 (trade names, manufactured by Sanyo Chemical Industries, Ltd.), TEXNOL R2 (trade name, manufactured by Nippon Nyukazai Co., Ltd.,) AM-301, AM-3130N (trade names, manufactured by Nikko Chemicals Co., Ltd.), AMPHITOL 20AB, AMPHITOL 20BS, AMPHITOL 24B, AMPHITOL 55AB, AMPHITOL 86B (trade names, manufactured by Kao Corporation), ADEKAAMPHOTE AB-35L, ADEKA-AMPHOTE PB-30L (trade names, manufactured by ADEKA Corporation), AMPHOREX CB-1, AMPHOREX LB-2 (trade names, manufactured by Miyoshi Oil & Fat Co., Ltd.), ENAGICOL C-30B, ENAGICOL L-30B (trade names, manufactured by Lion Corporation), OBAZORINE BC, OBAZORINE CAB-30, OBAZORINE LB-SF, OBAZORINE LB (trade names, manufactured by Toho Chemical Industry Co., Ltd.), SOFTAZOLINE CPB-R, SOFTAZOLINE CPB, SOFTAZOLINE LPB-R, SOFTAZOLINE LPB, SOFTAZOLINE MPB, SOFTAZOLINE PKBP (trade names, manufactured by Kawaken Fine Chemicals Co., Ltd.), and NISSAN ANON BDC-S, NISSAN ANON BDF-R, NISSAN ANON BDF-SF, NISSAN ANON BF, NISSAN ANON BL-SF, and NISSAN ANON BL (trade names, manufactured by NOF Corporation).

Examples of the commercial product of the compound represented by Formula (2) include AMPHITOL 20N (trade name, manufactured by Kao Corporation), SOFTAZOLINE LAO-C, SOFTAZOLINE LAO (trade names, manufactured by Kawaken Fine Chemicals Co., Ltd.), UNISAFE A-OM (trade name, manufactured by NOF Corporation), CATINAL AOC (trade name, manufactured by Toho Chemical Industry Co., Ltd.), and AROMOX DMC-W (trade name, manufactured by Lion Corp.).

In the specific developer according to the second aspect, the total content of the compounds represented by Formulae (1) and (2) is preferably from 0.01% by mass to 10% by mass, and more preferably from 0.01% by mass to 5% by mass.

Next, the developer according to the third aspect of the invention is further described.

Specific Developer According to Third Aspect

A process liquid used in the development step according to the third aspect of the invention (hereinafter may be referred to as "specific developer according to the third aspect") is an alkaline aqueous solution which contains an anionic surfactant and has a pH of 8.5 to 10.8. The anionic surfactant contributes to the improvement of processability.

Examples of the anionic surfactant include fatty acid salts, abietic acid salts, hydroxyalkane sulfonates, alkane sulfonates, dialkyl sulfosuccinates, linear alkylbenzene sulfonates, branched alkylbenzene sulfonates, alkyl naphthalene sulfonates, alkyl phenoxy polyoxyethylene propyl sulfonates, polyoxyethylene alkyl sulfophenyl ether salts, N-methyl-N-oleyl taurine sodiums, N-alkylsulfosuccinic acid monoamide disodium salts, petroleum sulfonates, sulfated castor oil, sulfated beef tallow oil, sulfates of fatty acid alkyl esters, alkyl sulfate salts, polyoxyethylene alkyl ether sulfate salts, fatty acid monoglyceride sulfate salts, polyoxyethylene alkylphenyl ether sulfate salts, polyoxyethylene styryl phenyl ether sulfate salts, alkyl phosphate salts, polyoxyethylene alkyl ether phosphate salts, polyoxyethylene alkyl phenyl ether phosphate salts, partially saponified styrene-maleic acid anhydride copolymers, partially saponified olefin-maleic acid anhydride copolymers, naphthalene sulfonate formalin condensates, aromatic sulfonates, and aromatic substituted polyoxyethylene sulfonates.

Among them, dialkyl sulfosuccinates, alkyl sulfate salts, and alkyl naphthalene sulfonates are particularly preferred.

The anionic surfactant used in the process liquid according to the third aspect of the invention is particularly preferably an anionic surfactant containing a sulfonic acid or a sulfonate.

The anionic surfactants may be used alone, or in combination of two or more thereof.

In the developer according to the third aspect, the content of the anionic surfactant is preferably from 0.5 to 15% by mass, more preferably from 1 to 10% by mass, and most preferably from 2 to 10% by mass.

PH of Specific Developers According to First to Third Aspects

The following explanations relate to the specific developers according to the first to third aspects of the invention.

The specific developers according to the first to third aspects of the invention each have a pH of 8.5 or more and 10.8 or less.

In order to maintain the pH of the developer within the range, a carbonate ion and a bicarbonate ion are preferably present as buffers in the developer. This is likely due to that the carbonate and bicarbonate ions control the variation of the pH during long-time use of the developer, and thus prevent the deterioration of developability and the generation of development wastes caused by pH variation. In order to establish the presence of the carbonate and bicarbonate ions in the developer, a carbonate and a bicarbonate (or hydrogen carbonate) may be added to the developer, or the pH may be adjusted after the addition of a carbonate or hydrogen carbonate, to generate carbonate and bicarbonate ions.

The carbonate and hydrogen carbonate useful for the pH adjustment are not particularly limited, but are preferably alkali metal salts. Examples of the alkali metal include lithium, sodium, and potassium. Among them, sodium is particularly preferred. They may be used alone, or in combination of two or more thereof.

In the third aspect, the developer has a pH which causes a buffer action, and specifically the pH must be from 8.5 to 10.8. When the pH is less than 8.5, the developability of the non-image areas deteriorates, and when the pH is more than 10.8, the processing ability deteriorates due to the influence of carbon dioxide in the air.

In the first to third aspects, the total amount of carbonate and bicarbonate is preferably from 0.3 to 20% by mass, more preferably from 0.5 to 10% by mass, and particularly preferably from 1 to 5% by mass, with respect to the mass of the alkaline aqueous solution. When the total amount is 0.3% by mass or more, the developability and processing ability are not deteriorate, and when 20% by mass or less, precipitates or crystals are hardly formed, and gelation hardly occurs during neutralization for the treatment of the waste developer, so that the treatment is carried out smoothly.

Further, in order to finely adjust the alkali concentration and help the dissolution of the photosensitive layer in the non-image areas, another alkaline agent such as an organic alkaline agent may be added. Examples of the organic alkaline agent include monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, pyridine, and tetramethylammonium hydroxide. Examples of inorganic salt include primary sodium phosphate, secondary sodium phosphate, primary potassium phosphate, secondary potassium phosphate, sodium tripolyphosphate, potassium pyrophosphate, and sodium hexametaphosphate.

These other alkaline chemicals may be used alone or in combination of two or more thereof.

Other Components

The specific developers according to the first to third aspects of the invention may each contain, in addition to the above-described components, other components such as a surfactant other than those described above, a humectant, an antiseptic, a chelate compound, an anti-foaming agent, an organic acid, an organic solvent, an inorganic acid, or an inorganic salt.

When the specific developer according to the first to third aspects contains a water-soluble polymer compound, the plate surface may be sticky particularly when the process liquid is exhausted. Therefore, in the specific developer according to the first to third aspects of the invention, the content of the water-soluble polymer compound is preferably 10 ppm or less, and more preferably 5 ppm or less, and it is most preferable that the specific developer contains no water-soluble polymer compound.

Examples of the "water-soluble polymer compound" as used herein include those having a hydrophilic group such as a hydroxyl group, a carboxyl group, a carboxylate group, a hydroxyethyl group, a polyoxyethyl group, a hydroxypropyl group, a polyoxypropyl group, an amino group, an aminoethyl group, an aminopropyl group, an ammonium group, an amide group, a carboxymethyl group, a sulfo group, or a phosphoric acid group.

Specific examples of the water-soluble polymer compound include gum arabic, casein, gelatin, starch derivatives, carboxymethyl cellulose and sodium salts thereof, cellulose acetate, sodium alginate, vinyl acetate-maleic acid copolymers, styrene-maleic acid copolymers, polyacrylic acids and salts thereof, polymethacrylic acids and salts thereof, homopolymers and copolymers of hydroxyethyl methacrylate, homopolymers and copolymers of hydroxyethyl acrylate, homopolymers and copolymers of hydroxypropyl methacrylate, homopolymers and copolymers of hydroxypropyl acrylate, homopolymers and copolymers of hydroxybutyl methacrylate, homopolymers and copolymers of hydroxybutyl acrylate, polyethylene glycols, hydroxypropylene polymers, polyvinyl alcohols, hydrolyzed polyvinyl acetate having a degree of hydrolysis of 60 mol % or more, preferably 80 mol % or more, polyvinyl formal, polyvinyl butyral, polyvinyl pyrrolidone, homopolymers and copolymers of acrylamide, homopolymers and copolymers of methacrylamide, homopolymers and copolymers of N-methylolacrylamide, polyvinyl pyrrolidone, alcohol-soluble nylon, and polyether of 2,2-bis-(4-hydroxyphenyl)-propane and epichlorohydrin.

Preferred examples of the humectant useful in the first to third aspects include ethylene glycol, propylene glycol, triethylene glycol, butylene glycol, hexylene glycol, diethylene glycol, dipropylene glycol, glycerol, trimethylolpropane, and diglycerol. The humectant may be used alone, or in combination of two or more thereof. In usual cases, the amount of the humectant is from 0.1 to 5% by mass with respect to the total mass of the process liquid.

Preferred examples of the antiseptic useful in the first to third aspects include phenols and derivatives thereof, formalin, imidazole derivatives, sodium dehydroacetate, 4-isothiazolin-3-one derivatives, benzoisothiazolin-3-one, 2-methyl-4-isothiazolin-3-one, benzotriazole derivatives, amidine guanidine derivatives, derivatives of quaternary ammonium salts, pyridine, quinoline, and guanidine, derivatives of diazine and triazole, derivatives of oxazole and oxazine, and nitro bromo alcohols such as 2-bromo-2-nitropropane-1,3-diol, and 1,1-dibromo-1-nitro-2-ethanol, and 1,1-dibromo-1-nitro-2-propanol. In order to exhibit efficacy against various molds and bacteria, it is preferred that two or more antiseptics be used in combination. The amount of the antiseptic must be enough for exhibiting stable efficacy against bacteria, molds, and yeasts, and the preferred amount is, though it depends on the type of the bacteria, molds, and yeasts, from 0.01 to 4% by mass with respect to the process liquid.

Examples of the chelate compound useful in the first to third aspects include ethylenediamine tetraacetic acid, potassium salts thereof, and sodium salts thereof; diethylenetriamine pentaacetic acid, potassium salts thereof, and sodium salts thereof; triethylenetetramine hexaacetic acid, potassium salts thereof, and sodium salts thereof; hydroxyethyl ethylenediamine triacetic acid, potassium salts thereof, and sodium salts thereof; nitrilotriacetic acid, and sodium salts thereof; 1-hydroxyethane-1,1-diphosphonic acid, potassium salts thereof, and sodium salts thereof; and organic phosphonic acids and phosphonoalkane tricarboxylic acids such as aminotri(methylenephosphonic acid), potassium salts thereof, and sodium salts thereof. Organic amine salts may be used in place of the sodium or potassium salts of the chelating agent. The chelating agent is preferably selected from those stably exists in the process liquid, and do not impair the printability. The amount of the chelating agent is preferably from 0.001 to 1.0% by mass with respect to the process liquid.

Examples of the anti-foaming agent useful in the first to third aspects include common silicon-containing compounds of self emulsification type, emulsification type, or nonionic type, having an HLB of 5 or less. Among them, silicon anti-foaming agents are preferred, which may be of emulsion-dispersion or soluble type. The content of the anti-foaming agent is preferably from 0.001 to 1.0% by mass with respect to the process liquid.

Examples of the organic acid useful in the first to third aspects include citric acid, acetic acid, oxalic acid, malonic acid, salicylic acid, caprylic acid, tartaric acid, malic acid, lactic acid, levulinic acid, p-toluenesulfonic acid, xylene sulfonic acid, phytic acid, and organic phosphonic acid. The organic acid may be in the form of an alkali metal salt or an ammonium salt. The content of the organic acid is preferably from 0.01 to 0.5% by mass with respect to the process liquid.

Examples of the organic solvent useful in the first to third aspects include aliphatic hydrocarbons (for example, hexane, heptane, and ISOPAR E, H, and G (trade names, manufactured by Esso Chemical Ltd.), gasoline, and kerosene), aromatic hydrocarbons (for example, toluene and xylene), hydrocarbon halides (for example, methylene dichloride, ethylene dichloride, trichlene, and monochlorobenzene), and polar solvents.

Examples of the polar solvent useful in the first to third aspects include alcohols (for example, methanol, ethanol, isopropanol, benzyl alcohol, 2-ethoxyethanol, diethylene glycol monoethyl ether, diethylene glycol monohexyl ether, triethylene glycol monomethyl ether, propylene glycol monomethyl ether, ethylene glycol monobenzyl ether, ethylene glycol monophenyl ether, methylphenyl carbinol, n-amyl alcohol, and methylamyl alcohol), ketones (for example, acetone, methyl ethyl ketone, and cyclohexanone), esters (for example, ethyl acetate, propyl acetate, butyl acetate, benzyl acetate, methyl lactate, propylene glycol monomethyl ether acetate, diethyl phthalate, and butyl levulinate), and other polar solvents (for example, triethyl phosphate, tricresyl phosphate, N-phenylethanolamine, and N-phenyldiethanolamine).

Examples of the inorganic acid and inorganic salt useful in the first to third aspects include phosphoric acid, metaphosphoric acid, ammonium dihydrogen phosphate, diammonium hydrogen phosphate, magnesium nitrate, sodium nitrate, potassium nitrate, ammonium nitrate, sodium sulfate, potassium sulfate, ammonium sulfate, sodium sulfite, ammonium sulfite, sodium hydrogen sulfate, and nickel sulfate. The content of the inorganic salt is preferably from 0.01 to 0.5% by mass with respect to the total mass of the process liquid.

When the organic solvent is insoluble in water, it may be solubilized to water using, for example, a surfactant. When the developer contains an organic solvent, the solvent concentration is preferably less than 40% by mass from the viewpoints of safety and flammability.

The specific developer according to the second aspect may further contain other anionic, nonionic, or cationic surfactant, as long as the effect of the invention is not impaired.

Examples of the anionic surfactant useful in the second aspect include fatty acid salts, abietic acid salts, hydroxyalkane sulfonates, alkane sulfonates, dialkyl sulfosuccinates, linear alkylbenzene sulfonates, branched alkylbenzene sulfonates, alkyl naphthalene sulfonates, alkyl phenoxy polyoxyethylene propyl sulfonates, polyoxyethylene alkyl sulfophenyl ether salts, N-methyl-N-oleyltaurine sodium salts, N-alkylsulfosuccinic acid monoamide disodium salts, petroleum sulfonates, sulfate salts, phosphate salts, partially saponified styrene-maleic acid anhydride copolymers, partially saponified olefin-maleic acid anhydride copolymers, naphthalene sulfonate formalin condensates, aromatic sulfonates, and aromatic-substituted polyoxyethylene sulfonates. Among them, dialkyl sulfosuccinates, alkyl sulfate salts, and alkyl naphthalene sulfonates are preferred.

Examples of the cationic surfactant useful in the second aspect include alkylamine salts, quaternary ammonium salts, polyoxyethylene alkyl amine salts, and polyethylene polyamine derivatives.

Examples of the nonionic surfactant useful in the second aspect include higher alcohol ethylene oxide adducts of polyethylene glycol, alkylphenol ethylene oxide adducts, polyethylene glycol adducts of aromatic compounds, fatty acid ethylene oxide adducts, polyhydric alcohol fatty acid ester ethylene oxide adducts, higher alkylamine ethylene oxide adducts, fatty acid amide ethylene oxide adducts, ethylene oxide adducts of oil and fat, polypropylene glycol ethylene oxide adducts, dimethylsiloxane-ethylene oxide block copolymers, dimethylsiloxane-(propylene oxide-ethylene oxide) block copolymers, fatty acid esters of polyhydric alcohol glycerol, fatty acid esters of pentaerythritol, fatty acid esters of sorbitol and sorbitan, fatty acid esters of sucrose, alkyl ethers of polyhydric alcohols, and fatty acid amides of alkanolamines.

Development Conditions

The development conditions in the first to third aspects are described below.

In the first to third aspects, the development temperature is usually 60° C. or lower, and preferably from about 15° C. to about 40° C. In a development treatment using an automatic developing machine, the developer may become exhausted according to the processing amount; therefore, the processing ability of the developer may be recovered using a replenisher or a fresh developer.

In a common development treatment, alkaline development is carried out, the alkali is removed in the pre-water washing step, gumming treatment is carried out in the gumming step, and drying is carried out in the drying step. On the other hand, in the invention, the use of an aqueous solution containing carbonate and bicarbonate ions and an anionic surfactant allows concurrent implementation of pre-water washing, development, and gumming. Accordingly, pre-water washing step is not particularly necessary, and pre-washing, development, and gumming are carried out with one liquid and one bath, followed by the drying step. Drying after the development is preferably carried out after removing the excessive portions of the process liquid using a squeeze roller or the like.

It is more preferred that the development step according to the first to third aspects be carried out using an automatic processor equipped with a rubbing member. Examples of the automatic processor include automatic processors as disclosed in JP-A Nos. 2-220061 and 60-59351, in which a planographic printing plate precursor after image-wise exposure is subjected to rubbing treatment while being transferred, and automatic processors as disclosed in U.S. Pat. Nos. 5,148,746 and 5,568,768, and U.K. Patent No. 2297719, in which a planographic printing plate precursor after image-wise exposure is mounted on a cylinder, and subjected to rubbing treatment while the cylinder is rotated. Among them, an automatic processor having a rotary brush roll as a rubbing member is particularly preferred.

The rotary brush roll used in the first to third aspects of the invention may be selected from appropriate ones, in consideration of the scratch resistance of the image areas, and the robustness of the support of the planographic printing plate precursor. The rotary brush roll may be selected from known ones which are composed of bristles inserted into a plastic or metal roll. Examples of the rotary brush roll include those described in JP-A Nos. 58-159533 and 3-100554, and brush roll as disclosed in Japanese Utility Model Application No. 62-167253, which is composed of bristles inserted into metal or plastic channel members in a line, the channel members being radially and tightly wound around a plastic or metal roll as the core.

The bristles may be made of plastic fibers (for example, synthetic fibers of polyesters such as polyethylene terephthalate or polybutylene terephthalate, polyamides such as nylon 6.6 or nylon 6.10, polyacryls such as polyacrylonitrile and poly(meth)alkyl acrylate, and polyolefins such as polypropylene and polystyrene). For example, the diameter of the bristles is preferably from 20 μm to 400 μm, and the length is preferably from 5 mm to 30 mm.

The outside diameter of the rotary brush roll is preferably from 30 mm to 200 mm, and the peripheral speed of the brush tip rubbing the plate surface is preferably from 0.1 m/sec to 5 m/sec. It is preferable to use plural rotary brush rolls.

The rotation direction of the rotary brush roll may be the same as or different (e.g., reverse direction) from the transfer direction of the planographic printing plate precursor. When two or more rotary brush rolls are used, it is preferred that at least one rotary brush roll rotate in the same direction as the transfer direction of the planographic printing plate precursor, and at least one rotary brush roll in the reverse direction. As a result of this, the photosensitive layer in the non-image areas is more reliably removed. Further, it is effective that the rotary brush roll is shaken in the rotation axis direction of the brush roll.

It is preferred that a continuous or discontinuous drying step be performed after the development step. The drying is carried out using, for example, hot air, infrared radiation, or far infrared rays.

FIG. 1 is a schematic view showing an example of the structure of an automatic processor suitably used for the method for making a planographic printing plate according to the first to third aspects of the invention. The automatic processor shown in FIG. 1 basically has a development unit 6 and a drying unit 10. A planographic printing plate precursor 4 is subjected to development and gumming in a development bath 20, and then dried in the drying unit 10.

More specifically, as shown in FIG. 1, the planographic printing plate precursor 4 is inserted into the automatic development apparatus, and then transferred to the development unit 6 by transfer rollers (input rollers) 16. In the development bath 20 in the development unit 6, a transfer roller 22, a brush roller 24, and squeeze rollers 26 are arranged from the upstream to downstream of the transfer direction, and backup rollers 28 are provided at appropriate locations between these rollers. While being transferred by the transfer roller 22, the planographic printing plate precursor 4 is immersed in a specific developer, and the brush roller 24 is rotated, whereby the planographic printing plate precursor 4 is subjected to development and gumming. The developed planographic printing plate precursor 4 is transferred to the subsequent drying unit 10 by the squeeze rollers (output rollers) 26. The drying unit 10 includes, from the upstream to downstream of the transfer direction, a guide roller 36, and two pairs of tandem rollers 38. The drying unit 10 also includes a drying device (not shown) such as a hot air feeding device or a heat generating device, and the drying device dries the planographic printing plate precursor 4 transferred to the drying unit 10.

The planographic printing plate obtained as described above may be subjected to printing. In order to impart higher printing durability to the planographic printing plate, the planographic printing plate is subjected to a burning treatment. Before burning the planographic printing plate, the planographic printing plate is preferably treated with a surface conditioning liquid as disclosed in JP-B Nos. 61-2518, 55-28062, JP-A Nos. 62-31859, and 61-159655. The planographic printing plate coated with a surface conditioning liquid is dried as necessary, and then heated to a high temperature with a burning processor (for example, burning processor: "BP-1300" (trade name) manufactured by Fujifilm Corporation). In the third aspect, the burning treatment is preferably carried out at a temperature of from 180 to 300° C. for about 1 to 20 minutes, though the heating temperature and time depend on the type of the components that form the image.

In the first and second aspects of the invention, the planographic printing plate thus obtained may be heated after development under extremely severe conditions. The heating temperature may be usually from 200 to 500° C.

When the temperature is low, sufficient image enhancement effect is not achieved, and when the temperature is too high, problems such as the deterioration of the support and pyrolysis of the image areas may occur.

The planographic printing plate obtained in this manner is mounted on an offset printing machine, and used for printing a lot of sheets.

EXAMPLES

Hereinbelow, the invention is further described in detail with reference to examples, but the invention is not limited to these examples.

Example According to First Aspect

Synthesis of Polyurethane Resin

Synthesis Example 1

In a 500-ml three-necked flask, 125 g of 4,4'-diphenylmethane diisocyanate and 67 g of 2,2-bis(hydroxymethyl) propionic acid were placed, and dissolved in 290 ml of dioxane. After adding 1 g of N,N-diethylaniline, the mixture was stirred for 6 hours under reflux by dioxane. After completion of the reaction, the reaction product was added slowly to a solution containing 4 L of water and 40 ml of acetic acid, thereby precipitating a polymer. The solid was dried in vacuo, thereby obtaining 185 g of polyurethane resin (1). The acid content thereof was 2.47 meq/g. The weight average molecular weight (polystyrene standard) was 28,000 as measured by GPC.

Synthesis Examples 2 to 7

Polyurethane resins (2) to (7) were synthesized in the same manner as in Synthesis Example 1, except that the starting material used in Synthesis Example 1 was replaced with the diisocyanate compounds and diol compounds shown in Table 1.

| Poly-urethane resin | Diisocyanate | | Diol | |
|---|---|---|---|---|
| (2) | OCN—C₆H₄—CH₂—C₆H₄—NCO | | HOCH₂—C(CH₃)(COOH)—CH₂OH | |
| | Diisocyanate:Diol = 1.5:1 | | Molecular weight: 7,000 | |
| (3) | OCN—C₆H₄—CH₂—C₆H₄—NCO | | HOCH₂—C(CH₃)(COOH)—CH₂OH | Ratio 75 mol % |
| | | | HOCH₂—C(CH₃)(CH₃)—CH₂OH | 25 mol % |
| | Diisocyanate:Diol = 1:1.2 | | Molecular weight: 12,000 | |
| (4) | Isophorone diisocyanate (with CH₃, CH₃, CH₃ substituents; NCO and CH₂—NCO) | Ratio 75 mol % | HOCH₂—C(CH₃)(COOH)—CH₂OH | Ratio 80 mol % |
| | OCN—C₆H₃(CH₃)—NCO (2,4-TDI) | 25 mol % | HOCH₂—C(CH₃)(CH₃)—CH₂OH | 20 mol % |
| | Diisocyanate:Diol = 1:1.1 | | Molecular weight: 17,000 | |
| (5) | OCN—C₆H₄—CH₂—C₆H₄—NCO | Ratio 80 mol % | HOCH₂—C(CH₂CH₃)(COOH)—CH₂OH | |
| | OCN—C₆H₃(CH₃)—NCO (2,4-TDI) | 20 mol % | | |
| | Diisocyanate:Diol = 1:1 | | Molecular weight: 23,000 | |
| (6) | OCN—C₆H₄—CH₂—C₆H₄—NCO | Ratio 75 mol % | HOCH₂—C(CH₃)(COOH)—CH₂OH | Ratio 75 mol % |
| | OCN—C₆H₃(CH₃)—NCO (2,4-TDI) | 25 mol % | HOCH₂—C₆H₁₀—CH₂OH (1,4-cyclohexanedimethanol) | 25 mol % |
| | Diisocyanate:Diol = 1:1 | | Molecular weight: 25,000 | |

| Polyurethane resin | Diisocyanate | | Diol | |
|---|---|---|---|---|
| | | Ratio | | Ratio |
| (7) | OCN—C6H4—CH2—C6H4—NCO | 80 mol % | HO—CH2—C(CH3)(COOH)—CH2—OH | 75 mol % |
| | 2,4-toluene diisocyanate (CH3-C6H3(NCO)2) | 20 mol % | HO—(CH2)10—OH | 25 mol % |
| | Diisocyanate:Diol = 1:1 | | Molecular weight: 25,000 | |

Examples A1 to A15, and Comparative Examples A1 to A5

Making of Planographic Printing Plate Precursor 1 Used in Example A1

Preparation of Support

An aluminum plate having a thickness of 0.24 mm (aluminum alloy composed of Si: 0.06% by mass, Fe: 0.30% by mass, Cu: 0.014% by mass, Mn: 0.001% by mass, Mg: 0.001% by mass, Zn: 0.001% by mass, and Ti: 0.03% by mass, the balance being Al and unavoidable impurities) was subjected to continuous surface treatment as described below.

Using an alternating voltage at 60 Hz, electrochemical surface-roughening treatment was continuously carried out. The electrolytic solution was a 10 g/l nitric acid aqueous solution containing 5 g/l of aluminum ions and 0.007% by mass of ammonium ions, and the solution temperature was 80° C. After water washing, the aluminum plate was subjected to etching treatment at 32° C. with a spray containing 26% by mass of sodium hydroxide and 6.5% by mass of aluminum ions, whereby the aluminum plate was dissolved at a rate 0.20 g/m². After washing with water spray, the aluminum plate was subjected to desmutting treatment with a spray of a 25% by mass sulfuric acid aqueous solution containing 0.5% by mass of aluminum ions at a temperature of 60° C., and washed with water spray.

Anodic oxidation treatment was carried out using an anodic oxidation apparatus of a two-stage electrolysis treatment method. The electrolytic solution fed to an electrolysis unit was sulfuric acid. Thereafter, the aluminum plate was washed with water spray. The final oxide film weight was 2.7 g/m².

The aluminum support obtained after the anodic oxidation treatment was immersed in a treatment bath containing a 1% by mass sodium silicate No. 3 aqueous solution at 30° C. for 10 seconds, thereby carrying out alkali metal silicate treatment (silicate treatment). Thereafter, the aluminum support was washed with water spray.

The aluminum support after the alkali metal silicate treatment obtained as described above was coated with a undercoat liquid having the following formulation, and dried at 80° C. for 15 seconds, thereby forming a coating film. The coating weight of the film after drying was 15 mg/m².

Undercoat Solution

| β-Alanine: | 0.5 g |
|---|---|
| Methanol: | 95 g |
| Water: | 5 g |

Formation of Recording Layer

The support obtained as described above was coated with a lower layer coating liquid 1 having the following formulation, using a bar coater to give a coating weight of 1.5 g/m², and dried at 160° C. for 44 seconds, immediately followed by cooling with cold air at 17 to 20° C. until the support temperature decreased to 35° C.

Lower Layer Coating Liquid 1

| N-Phenyl maleimide/methacrylic acid/methacrylamide copolymer: (molar ratio: 45/20/35; Mw: 50,000) | 1.0 g |
|---|---|
| Cyanine dye A represented by the following structure formula: | 0.017 g |
| CRYSTAL VIOLET (trade name, manufactured by Hodogaya Chemical Co., Ltd.): | 0.015 g |
| MEGAFAC F-177 (trade name, manufactured by DIC Corporation, fluorine surfactant): | 0.05 g |
| γ-Butyllactone: | 10 g |
| Methyl ethyl ketone: | 10 g |
| 1-Methoxy-2-propanol: | 8 g |

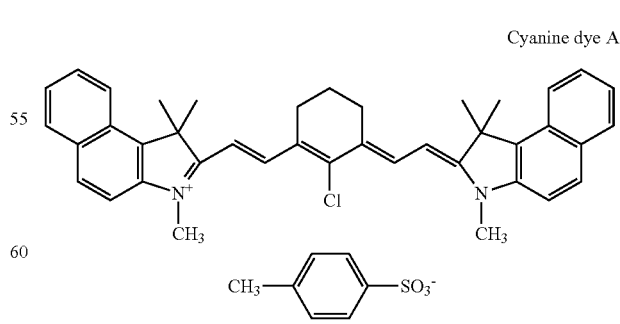

Cyanine dye A

Thereafter, the support was coated with an upper layer coating liquid 1 having the following formulation, using a bar coater to give a coating weight of 0.5 g/m², and dried at 130° C. for 40 seconds, and slowly cooled with air at 20 to 26° C., thereby producing a planographic printing plate precursor 1.

Upper Layer Coating Liquid 1

| | |
|---|---|
| Polyurethane resin (1) of Synthesis Example 1: | 30.0 g |
| BYK-333 (trade name, manufactured by BYK-Chemie, polyether-modified polydimethylsiloxane): | 0.3 g |
| Ethyl violet: | 0.03 g |
| MEGAFAC F-177 (trade name, fluorine surfactant): | 0.05 g |
| 3-Pentanone: | 60 g |
| Propylene glycol monomethyl ether acetate: | 8 g |

Making of Planographic Printing Plate Precursors 2 to 7 Used in Examples A2 to A7, A10 to A15, and Comparative Examples A4 and A5

Planographic printing plate precursors 2 to 7 were made in the same manner as the planographic printing plate precursor 1, except that the polyurethane resin (1) used in the upper layer coating liquid 1 for the planographic printing plate precursor 1 was replaced with the polyurethane resins (2) to (7) obtained in the above-described Synthesis Examples, respectively.

Planographic Printing Plate Precursor 8 Used in Example A8

A planographic printing plate precursor 8 was made in the same manner as the planographic printing plate precursor 1, except that the polyorganosiloxane used in the upper layer coating liquid 1 for the planographic printing plate precursor 1 was replaced with TEGO GLIDE 410 (trade name, a polysiloxane polyether copolymer available from Tego Chemie Service GmbH).

Planographic Printing Plate Precursor 9 Used in Example A9

A planographic printing plate precursor 9 was made in the same manner as the planographic printing plate precursor 1, except that the upper layer coating liquid for the planographic printing plate precursor 1 was replaced with an upper layer coating liquid 2 described below.

Upper Layer Coating Liquid 2

| | |
|---|---|
| Polyurethane (1) of Synthesis Example 1: | 30.0 g |
| BYK-333 (trade name, polyether-modified polydimethylsiloxane, manufactured by BYK-Chemie): | 0.3 g |
| Cyanine dye A represented by the above structure formula: | 1.5 g |
| Ethyl violet: | 0.03 g |
| MEGAFAC F-177 (trade name, fluorine surfactant): | 0.05 g |
| 3-Pentanone: | 60 g |
| Propylene glycol monomethyl ether acetate: | 8 g |

Planographic Printing Plate Precursor 10 Used in Comparative Example A1

A planographic printing plate precursor 10 was made in the same manner as the planographic printing plate precursor 1, except that an upper layer coating liquid was prepared without adding the polyorganosiloxane used for the preparation of the upper layer coating liquid 1 for the planographic printing plate precursor 1.

Planographic Printing Plate Precursor 11 Used in Comparative Example A2

A planographic printing plate precursor 11 was made in the same manner as the planographic printing plate precursor 1, except that an upper layer coating liquid was prepared in such a manner that the comparative resin (1) (alkali-solubility polymer; weight average molecular weight: 50,000) shown below was used in place of the polyurethane resin (1) used in the preparation of the upper layer coating liquid 1 for the planographic printing plate precursor 1.

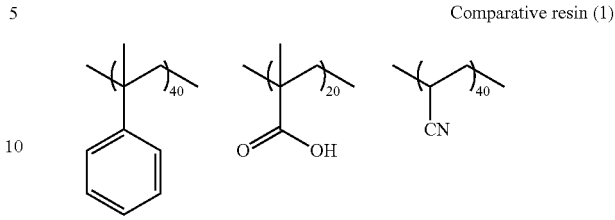

Comparative resin (1)

Planographic Printing Plate Precursor 12 Used in Comparative Example A3

A planographic printing plate precursor 12 was made in the same manner as the planographic printing plate precursor 9, except that a lower layer coating liquid was prepared without adding cyanine dye A used for the preparation of the lower layer coating liquid 1 for the planographic printing plate precursor 9.

Plate Making and Evaluation of Planographic Printing Plate Precursors

The planographic printing plate precursors 1 to 12 obtained above were subjected to plate making treatment through the following exposure step and development step, and then subjected to the following evaluations. The details of the exposure step and development step, and the evaluation methods are as described below. The evaluation results are shown in Table 1.

Exposure Step

The planographic printing plate precursors 1 to 12 obtained above were exposed to light (laser power: 8.5 W, rotation speed: 185 rpm) using an exposure apparatus (trade name: TRENDSETTER F, manufactured by Eastman Kodak Company).

In order to evaluate development wastes, the entire surfaces of the precursors were exposed to light, thereby forming a clear image.

Development Step

The planographic printing plate precursors 1 to 12 after exposure were subjected to a development treatment using an automatic processor having a configuration as shown in FIG. 1 [development bath: 25 L, plate transfer speed: 100 cm/min, one brush roll having an outside diameter of 50 mm implanted with polybutylene terephthalate fibers (bristle diameter: 200 μm, bristle length: 17 mm) rotates in the same direction with the transfer direction at a rate of 200 rpm (peripheral speed of the brush tip: 0.52 m/sec), and drying temperature: 80° C.], with the combination of the developer shown in Table 1, at a temperature of 30° C., until the processed amount reached 20 m²/L.

Specific Developer A1

| | |
|---|---|
| Water: | 9,352 g |
| Sodium carbonate: | 128 g |
| Sodium hydrogen carbonate: | 70 g |
| NONIPOL 100: | 300 g |
| [trade name, polyoxyethylene (n average = 10) nonyl phenyl ether, manufactured by Sanyo Chemical Industries, Ltd.] | |
| Trisodium citrate | 150 g |
| (pH: 9.8) | |

Specific Developer A2

| Water: | 9,352 g |
|---|---|
| Sodium carbonate: | 128 g |
| Sodium hydrogen carbonate: | 70 g |
| NEWCOL B-13 | 300 g |
| [trade name, polyoxyethylene (n average = 12) naphthyl ether, manufactured by Nippon Nyukazai Co., Ltd.] | |
| Trisodium citrate | 150 g |
| (pH: 9.8) | |

Specific Developer A3

| Water: | 9,352 g |
|---|---|
| Sodium carbonate: | 128 g |
| Sodium hydrogen carbonate: | 70 g |
| Compound of Specific Example (Y-5): | 300 g |
| Trisodium citrate: | 150 g |
| (pH: 9.8) | |

Specific Developer A4

| Water: | 9,352 g |
|---|---|
| Sodium carbonate: | 128 g |
| Sodium hydrogen carbonate: | 70 g |
| Compound of Specific Example (Y-6): | 300 g |
| Trisodium citrate: | 150 g |
| (pH: 9.8) | |

Specific Developer A5

| Water: | 9,352 g |
|---|---|
| Sodium carbonate: | 128 g |
| Sodium hydrogen carbonate: | 70 g |
| Compound of Specific Example (Y-19): | 300 g |
| Trisodium citrate: | 150 g |
| (pH: 9.8) | |

Specific Developer A6

| Water: | 9,352 g |
|---|---|
| Sodium carbonate: | 188 g |
| Sodium hydrogen carbonate: | 10 g |
| NEWCOL B-13: | 300 g |
| [trade name, polyoxyethylene (n average = 12) naphthyl ether, manufactured by Nippon Nyukazai Co., Ltd.] | |
| Trisodium citrate: | 150 g |
| (pH: 8.8) | |

Specific Developer A7

| Water: | 9,352 g |
|---|---|
| Sodium carbonate: | 10 g |
| Sodium hydrogen carbonate: | 188 g |
| NEWCOL B-13: | 300 g |
| [trade name, polyoxyethylene (n average = 12) naphthyl ether, manufactured by Nippon Nyukazai Co., Ltd.] | |
| Trisodium citrate: | 150 g |
| (pH: 9.8) | |

Comparative Developer A1

| Water: | 9,647 g |
|---|---|
| Sodium carbonate: | 130 g |
| Sodium hydrogen carbonate: | 73 g |
| Trisodium citrate: | 150 g |
| (pH: 9.8) | |

Comparative Developer A2

| Water: | 9,350 g |
|---|---|
| Boric acid: | 74 g |
| Sodium hydroxide: | 126 g |
| NEWCOL B-13: | 300 g |
| [trade name, polyoxyethylene (n average = 12) naphthyl ether, manufactured by Nippon Nyukazai Co., Ltd.] | |
| Trisodium citrate: | 150 g |
| (pH: 8.4) | |

Evaluation

1. Evaluation of Development Wastes

The planographic printing plate precursors, which had been subjected to entire exposure for the evaluation of development wastes in the exposure step, were subjected to a development treatment in the development step using the automatic developing machine, and after the development treatment, the number of wastes adhered to the planographic printing plate precursors were counted by visual observation, in terms of the number of wastes per square meter.

2. Evaluation of Developability

The planographic printing plates which had been subjected to image-wise exposure in the exposure step, and then developed in the development step were mounted on a printing machine SOR-M (trade name, manufactured by Heidelberger Druckmaschinen AG), and printing was performed using a dampening water (trade name: EU-3, an etchant manufactured by Fujifilm Corporation)/water/isopropyl alcohol=1/89/10 (capacity ratio)) and a FUSION G (N) black ink (trade name, manufactured by DIC Corporation), at a print speed of 6000 sheets per hour. The printed materials thus obtained were observed visually for the presence or absence of background stains (scumming) on the non-image areas.

TABLE 1

| | Component of Planographic lower layer | | Components of upper layer | | | | Evaluation results Development | |
|---|---|---|---|---|---|---|---|---|
| | printing plate precursor | Infrared ray absorbing agent | Polyurethane resin | Polyorganosiloxane | Infrared ray absorbing agent | Developer | wastes (number/m$^2$) | Developability |
| Example A1 | 1 | Cyanine dye A | Polyurethane resin (1) | BYK-333 | None | Specific developer A2 | 0 | No stain |
| Example A2 | 2 | Cyanine dye A | Polyurethane resin (2) | BYK-333 | None | Specific developer A2 | 0 | No stain |
| Example A3 | 3 | Cyanine dye A | Polyurethane resin (3) | BYK-333 | None | Specific developer A2 | 0 | No stain |
| Example A4 | 4 | Cyanine dye A | Polyurethane resin (4) | BYK-333 | None | Specific developer A2 | 0 | No stain |
| Example A5 | 5 | Cyanine dye A | Polyurethane resin (5) | BYK-333 | None | Specific developer A2 | 0 | No stain |
| Example A6 | 6 | Cyanine dye A | Polyurethane resin (6) | BYK-333 | None | Specific developer A2 | 0 | No stain |
| Example A7 | 7 | Cyanine dye A | Polyurethane resin (7) | BYK-333 | None | Specific developer A2 | 0 | No stain |
| Example A8 | 8 | Cyanine dye A | Polyurethane resin (7) | TEGO GLIDE 410 | None | Specific developer A2 | 0 | No stain |
| Example A9 | 9 | Cyanine dye A | Polyurethane resin (7) | BYK-333 | Cyanine dye A | Specific developer A2 | 0 | No stain |
| Example 10 | 7 | Cyanine dye A | Polyurethane resin (7) | BYK-333 | None | Specific developer A1 | 0 | No stain |
| Example A11 | 7 | Cyanine dye A | Polyurethane resin (7) | BYK-333 | None | Specific developer A3 | 0 | No stain |
| Example A12 | 7 | Cyanine dye A | Polyurethane resin (7) | BYK-333 | None | Specific developer A4 | 0 | No stain |
| Example A13 | 7 | Cyanine dye A | Polyurethane resin (7) | BYK-333 | None | Specific developer A5 | 0 | No stain |
| Example A14 | 7 | Cyanine dye A | Polyurethane resin (7) | BYK-333 | None | Specific developer A6 | 0 | No stain |
| Example A15 | 7 | Cyanine dye A | Polyurethane resin (7) | BYK-333 | None | Specific developer A7 | 0 | No stain |
| Comparative Example A1 | 10 | Cyanine dye A | Polyurethane resin (7) | None | None | Specific developer A2 | 20 | No stain |
| Comparative Example A2 | 11 | Cyanine dye A | Comparative resin (1) | BYK-333 | None | Specific developer A2 | 150 | No stain |
| Comparative Example A3 | 12 | None | Polyurethane resin (7) | BYK-333 | Cyanine dye A | Specific developer A2 | 0 | Slight scumming |
| Comparative Example A4 | 7 | Cyanine dye A | Polyurethane resin (7) | BYK-333 | None | Comparative developer A1 | 50 | Scumming |
| Comparative Example A5 | 7 | Cyanine dye A | Polyurethane resin (7) | BYK-333 | None | Comparative developer A2 | 30 | Scumming |

Table 1 shows that when the method for making a planographic printing plate according to the first aspect of the invention is used, the generation of wastes in the development bath was prevented, and good developability was achieved, in spite of the one-bath treatment using a weak alkaline developer. Further, the planographic printing plates obtained by the making method exhibited a good printing durability after a lapse of long time after the development treatment, and printed materials with high quality images were obtained.

On the other hand, according to the method for making a planographic printing plate that does not fall within the scope of the first aspect of the invention, generation of development wastes and background stains were observed. In addition, the planographic printing plates thus obtained showed poor printing durability.

Examples According to Second Aspect

Examples B1 to B15, Comparative Examples B1 to B5

Making of Planographic Printing Plate Precursors 1 to 12

In Examples B1 to B15 and Comparative Examples B1 to B5 according to the second aspect, the planographic printing plate precursors 1 to 12 made in Examples according to the first aspect were used.

Plate Making and Evaluation of Planographic Printing Plate Precursors

The planographic printing plate precursors 1 to 12 obtained above were subjected to plate making treatment through the following exposure step and development step, and then subjected to the following evaluations. The details of the exposure step and development step, and the evaluation methods are described below. The evaluation results are shown in Table 2.

Exposure Step

The planographic printing plate precursors 1 to 12 obtained above were exposed to light (laser power: 8.5 W, rotation speed: 185 rpm) using an exposure apparatus (trade name: TRENDSETTER F, manufactured by Eastman Kodak Company).

In order to evaluate development wastes, the entire surfaces of the precursors were exposed to light, thereby forming a clear image.

Development Step

The planographic printing plate precursors 1 to 12 after exposure were subjected to a development treatment using an automatic processor having a configuration as shown in FIG. 1 [development bath: 25 L, plate transfer speed: 100 cm/min, one brush roll having an outside diameter of 50 mm implanted with polybutylene terephthalate fibers (bristle diameter: 200 μm, bristle length: 17 mm) rotates in the same direction with the transfer direction at a rate of 200 rpm (peripheral speed of the brush tip: 0.52 m/sec), and drying temperature: 80° C.], with the combination of the developer shown in Table 1, at a temperature of 30° C., until the processed amount reached 20 m²/L.

Specific Developer B1

| | |
|---|---|
| Water: | 7,772 g |
| Sodium carbonate: | 143 g |
| Sodium hydrogen carbonate: | 60 g |
| TAKESURF C-157L (40 mass % aqueous solution): | 1,875 g |
| (trade name, compound of Specific Example (W-2), manufactured by Takemoto Oil & Fat Co., Ltd.) | |
| Trisodium citrate: | 150 g |
| (pH: 9.8) | |

Specific Developer B2

| | |
|---|---|
| Water: | 7,147 g |
| Sodium carbonate: | 143 g |
| Sodium hydrogen carbonate: | 60 g |
| TAKESURF C-157L (30 mass % aqueous solution): | 2,500 g |
| (trade name, compound of Specific Example (W-2), manufactured by Takemoto Oil & Fat Co., Ltd.) | |
| Trisodium citrate: | 150 g |
| (pH: 9.8) | |

Specific Developer B3

| | |
|---|---|
| Water: | 7,147 g |
| Sodium carbonate: | 143 g |
| Sodium hydrogen carbonate: | 60 g |
| Compound of Specific Example (W-1) (30 mass % aqueous solution): | 2,500 g |
| Trisodium citrate: | 150 g |
| (pH: 9.8) | |

Specific Developer B4

| | |
|---|---|
| Water: | 7,147 g |
| Sodium carbonate: | 143 g |
| Sodium hydrogen carbonate: | 60 g |
| Compound of Specific Example (W-7) (30 mass % aqueous solution): | 2,500 g |
| Trisodium citrate: | 150 g |
| (pH: 9.8) | |

Specific Developer B5

| | |
|---|---|
| Water: | 7,147 g |
| Sodium carbonate: | 143 g |
| Sodium hydrogen carbonate: | 60 g |
| Compound of Specific Example (W-9) (30 mass % aqueous solution): | 2,500 g |
| Trisodium citrate: | 150 g |
| (pH: 9.8) | |

Specific Developer B6

| | |
|---|---|
| Water: | 7,147 g |
| Sodium carbonate: | 193 g |
| Sodium hydrogen carbonate: | 10 g |
| TAKESURF C-157L (30 mass % aqueous solution): | 2,500 g |
| (trade name, compound of Specific Example (W-2), manufactured by Takemoto Oil & Fat Co., Ltd.) | |
| Trisodium citrate: | 150 g |
| (pH: 8.8) | |

Specific Developer B7

| | |
|---|---|
| Water: | 7,147 g |
| Sodium carbonate: | 10 g |
| Sodium hydrogen carbonate: | 193 g |
| TAKESURF C-157L (30 mass % aqueous solution): | 2,500 g |
| (trade name, compound of Specific Example (W-2), manufactured by Takemoto Oil & Fat Co., Ltd.) | |
| Trisodium citrate: | 150 g |
| (pH: 9.8) | |

Comparative Developer B1

| | |
|---|---|
| Water: | 9,647 g |
| Sodium carbonate: | 130 g |
| Sodium hydrogen carbonate: | 73 g |
| Trisodium citrate: | 150 g |
| (pH: 9.8) | |

Comparative Developer B2

| | |
|---|---|
| Water: | 8,576 g |
| Boric acid: | 74 g |
| Sodium hydrate: | 126 g |
| TAKESURF C-157L (30 mass % aqueous solution): | 1,074 g |
| (trade name, compound of Specific Example (W-2), manufactured by Takemoto Oil & Fat Co., Ltd.) | |
| Trisodium citrate: | 150 g |
| (pH: 8.4) | |

Evaluation

1. Evaluation of Development Wastes

The planographic printing plate precursors, which had been subjected to entire exposure for the evaluation of development wastes in the exposure step, were subjected to a development treatment in the development step using the automatic developing machine, and after the development treatment, the number of wastes adhered to the planographic printing plate precursors were counted by visual observation, in terms of the number of wastes per square meter.

2. Evaluation of Developability

The planographic printing plates which had been subjected to image-wise exposure in the exposure step, and then developed in the development step were mounted on a printing machine SOR-M (trade name, manufactured by Heidelberger Druckmaschinen AG), and printing was performed using a dampening water (trade name: EU-3, an etchant manufactured by Fujifilm Corporation)/water/isopropyl alcohol=1/89/10 (capacity ratio)) and a FUSION G (N) black ink (trade name, manufactured by DIC Corporation), at a print speed of 6000 sheets per hour. The printed materials thus obtained were observed visually for the presence or absence of background stains (scumming) on the non-image areas.

TABLE 2

| | Component of Planographic lower layer | | Components of upper layer | | | | Evaluation results Development | |
|---|---|---|---|---|---|---|---|---|
| | printing plate precursor | Infrared ray absorbing agent | Polyurethane resin | Polyorganosiloxane | Infrared ray absorbing agent | Developer | wastes (number/m$^2$) | Developability |
| Example B1 | 1 | Cyanine dye A | Polyurethane resin (1) | BYK-333 | None | Specific developer B2 | 0 | No stain |
| Example B2 | 2 | Cyanine dye A | Polyurethane resin (2) | BYK-333 | None | Specific developer B2 | 0 | No stain |
| Example B3 | 3 | Cyanine dye A | Polyurethane resin (3) | BYK-333 | None | Specific developer B2 | 0 | No stain |
| Example B4 | 4 | Cyanine dye A | Polyurethane resin (4) | BYK-333 | None | Specific developer B2 | 0 | No stain |
| Example B5 | 5 | Cyanine dye A | Polyurethane resin (5) | BYK-333 | None | Specific developer B2 | 0 | No stain |
| Example B6 | 6 | Cyanine dye A | Polyurethane resin (6) | BYK-333 | None | Specific developer B2 | 0 | No stain |
| Example B7 | 7 | Cyanine dye A | Polyurethane resin (7) | BYK-333 | None | Specific developer B2 | 0 | No stain |
| Example B8 | 8 | Cyanine dye A | Polyurethane resin (7) | TEGO GLIDE 410 | None | Specific developer B2 | 0 | No stain |
| Example B9 | 9 | Cyanine dye A | Polyurethane resin (7) | BYK-333 | Cyanine dye A | Specific developer B2 | 0 | No stain |
| Example 10 | 7 | Cyanine dye A | Polyurethane resin (7) | BYK-333 | None | Specific developer B1 | 0 | No stain |
| Example B11 | 7 | Cyanine dye A | Polyurethane resin (7) | BYK-333 | None | Specific developer B3 | 0 | No stain |
| Example B12 | 7 | Cyanine dye A | Polyurethane resin (7) | BYK-333 | None | Specific developer B4 | 0 | No stain |
| Example B13 | 7 | Cyanine dye A | Polyurethane resin (7) | BYK-333 | None | Specific developer B5 | 0 | No stain |
| Example B14 | 7 | Cyanine dye A | Polyurethane resin (7) | BYK-333 | None | Specific developer B6 | 0 | No stain |
| Example B15 | 7 | Cyanine dye A | Polyurethane resin (7) | BYK-333 | None | Specific developer B7 | 0 | No stain |
| Comparative Example B1 | 10 | Cyanine dye A | Polyurethane resin (7) | None | None | Specific developer B2 | 15 | No stain |
| Comparative Example B2 | 11 | Cyanine dye A | Comparative resin (1) | BYK-333 | None | Specific developer B2 | 120 | No stain |
| Comparative Example B3 | 12 | None | Polyurethane resin (7) | BYK-333 | Cyanine dye A | Specific developer B2 | 0 | Slight scumming |
| Comparative Example B4 | 7 | Cyanine dye A | Polyurethane resin (7) | BYK-333 | None | Comparative developer B1 | 50 | Scumming |
| Comparative Example B5 | 7 | Cyanine dye A | Polyurethane resin (7) | BYK-333 | None | Comparative developer B2 | 25 | Scumming |

Table 2 shows that in the method for making a planographic printing plate according to the second aspect of the invention, the generation of wastes in the development bath was prevented, and good developability was achieved, in spite of the one-bath treatment using a weak alkaline developer. Further, the planographic printing plates obtained by the making method achieved good printing durability after a lapse of long time after the development treatment, and printed materials with high quality images were obtained.

On the other hand, according to Comparative Examples B4 and B5 which used the developer that does not fall within the scope of the second aspect of the invention, generation of development wastes and background stains were observed. In addition, the planographic printing plates thus obtained showed poor printing durability.

Examples According to Third Aspect

Examples C1 to C15, Comparative Examples C1 to C5

Making of Planographic Printing Plate Precursors 1 to 12

In Examples C1 to C15 and Comparative Examples C1 to C5 according to the third aspect, the planographic printing plate precursors 1 to 12 made in Examples according to the first aspect were used.

Evaluation

Exposure Step

The planographic printing plate precursors 1 to 12 obtained above were exposed to light (laser power: 8.5 W, rotation speed: 185 rpm) using an exposure apparatus (trade name: TRENDSETTER F, manufactured by Eastman Kodak Company).

In order to evaluate development wastes, the entire surfaces of the precursors were exposed to light, thereby forming a clear image.

Development Step

The planographic printing plate precursors 1 to 12 after exposure were subjected to a development treatment using an automatic processor having a configuration as shown in FIG. 1 [development bath: 25 L, plate transfer speed: 100 cm/min, one brush roll having an outside diameter of 50 mm implanted with polybutylene terephthalate fibers (bristle diameter: 200 μm, bristle length: 17 mm) rotates in the same direction with the transfer direction at a rate of 200 rpm (peripheral speed of the brush tip: 0.52 m/sec), and drying temperature: 80° C.], with the combination of the developer shown in Table 3, at a temperature of 30° C., until the processed amount reached 20 m$^2$/L.

Specific Developer C1

| Water: | 8963.8 g |
|---|---|
| Sodium carbonate: | 200 g |
| Sodium hydrogen carbonate: | 100 g |
| NEWCOL B4SN (61% aqueous solution): (trade name, polyoxyethylene naphthyl ether sulfate, anionic surfactant, manufactured by Nippon Nyukazai Co., Ltd.) | 656 g |
| EDTA 4Na: | 80 g |
| 2-Bromo-2-nitro propane-1,3-diol: | 0.1 g |
| 2-Methyl-4-isothiazolin-3-one: (pH: 9.7) | 0.1 g |

Specific Developer C2

| Water: | 8,665 g |
|---|---|
| Sodium carbonate: | 150 g |
| Sodium carbonate: | 80 g |
| ELEMINOL MON (47% aqueous solution) (trade name, sodium dodecyl diphenyl ether disulfonate, anionic surfactant, manufactured by Sanyo Chemical Industries, Ltd.) | 745 g |
| Ammonium dihydrogen phosphate: | 180 g |
| Sodium hexametaphosphate: (pH: 9.3) | 180 g |

Specific Developer C3

| Water: | 8150.8 g |
|---|---|
| Sodium carbonate: | 200 g |
| Sodium hydrogen carbonate: | 80 g |
| PELEX NBL (35% aqueous solution): (trade name, sodium alkyl naphthalene sulfonate, anionic surfactant, manufactured by Kao Corporation) | 1,429 g |
| Citric acid: | 40 g |
| Ammonium dihydrogen phosphate: | 20 g |
| Propylene glycol: | 80 g |
| 2-Bromo-2-nitro propane-1,3 diol: | 0.1 g |
| 2-Methyl-4-isothiazolin-3-one: (pH: 9.8) | 0.1 g |

Specific Developer C4

| Water: | 8,665 g |
|---|---|
| Sodium carbonate: | 242 g |
| Sodium hydrogen carbonate: | 12 g |
| ELEMINOL MON (47% aqueous solution): (trade name, sodium dodecyl diphenyl ether disulfonate, anionic surfactant, manufactured by Sanyo Chemical Industries, Ltd.) | 745 g |
| Ammonium dihydrogen phosphate: | 180 g |
| Sodium hexametaphosphate: (pH: 8.8) | 180 g |

Specific Developer C5

| Water: | 8,665 g |
|---|---|
| Sodium carbonate: | 12 g |
| Sodium hydrogen carbonate: | 242 g |
| ELEMINOL MON (47% aqueous solution): (trade name, sodium dodecyl diphenyl ether disulfonate, anionic surfactant, manufactured by Sanyo Chemical Industries, Ltd.) | 745 g |

| Ammonium dihydrogen phosphate: | 180 g |
|---|---|
| Sodium hexametaphosphate: (pH: 10.3) | 180 g |

Comparative Developer C1

| Water: | 9779.8 g |
|---|---|
| Sodium carbonate: | 130 g |
| Sodium hydrogen carbonate: | 70 g |
| Ammonium dihydrogen phosphate: | 20 g |
| 2-Bromo-2-nitro propane-1,3-diol: | 0.1 g |
| 2-Methyl-4-isothiazolin-3-one: (pH: 9.7) | 0.1 g |

Comparative Developer C2

| Water: | 8,665 g |
|---|---|
| Boric acid: | 74 g |
| Sodium hydrate: | 126 g |
| ELEMINOL MON (47% aqueous solution): (sodium dodecyl diphenyl ether disulfonate, anionic surfactant, manufactured by Sanyo Chemical Industries, Ltd.) | 745 g |
| Ammonium dihydrogen phosphate: | 180 g |
| Sodium hexametaphosphate: (pH: 8.4) | 180 g |

Evaluation

Evaluation was carried out using the planographic printing plate precursors and developers as shown in Table 3, respectively. Results are shown in Table 3.

1. Evaluation of Development Wastes

The planographic printing plate precursors, which had been subjected to entire exposure for the evaluation of development wastes in the exposure step, were subjected to a development treatment in the development step using the automatic developing machine, and after the development treatment, the number of wastes adhered to the planographic printing plate precursors were counted by visual observation, in terms of the number of wastes per square meter.

2. Evaluation of Developability

The planographic printing plates which had been subjected to image-wise exposure in the exposure step, and then developed in the development step were mounted on a printing machine SOR-M (trade name, manufactured by Heidelberger Druckmaschinen AG), and printing was performed using a dampening water (trade name: EU-3, an etchant manufactured by Fujifilm Corporation)/water/isopropyl alcohol=1/89/10 (capacity ratio)) and a FUSION G (N) black ink (trade name, manufactured by DIC Corporation), at a print speed of 6000 sheets per hour. The printed materials thus obtained were observed visually for the presence or absence of background stains (scumming) on the non-image areas.

TABLE 3

| | Planographic printing plate precursor | Component of lower layer | | Components of upper layer | | | Evaluation results | |
|---|---|---|---|---|---|---|---|---|
| | | Infrared ray absorbing agent | Polyurethane resin | Polyorganosiloxane | Infrared ray absorbing agent | Developer | Development wastes (number/m$^2$) | Developability |
| Example C1 | 1 | Cyanine dye A | Polyurethane resin (1) | BYK-333 | None | Specific developer C2 | 0 | No stain |
| Example C2 | 2 | Cyanine dye A | Polyurethane resin (2) | BYK-333 | None | Specific developer C2 | 0 | No stain |
| Example C3 | 3 | Cyanine dye A | Polyurethane resin (3) | BYK-333 | None | Specific developer C2 | 0 | No stain |
| Example C4 | 4 | Cyanine dye A | Polyurethane resin (4) | BYK-333 | None | Specific developer C2 | 0 | No stain |
| Example C5 | 5 | Cyanine dye A | Polyurethane resin (5) | BYK-333 | None | Specific developer C2 | 0 | No stain |
| Example C6 | 6 | Cyanine dye A | Polyurethane resin (6) | BYK-333 | None | Specific developer C2 | 0 | No stain |
| Example C7 | 7 | Cyanine dye A | Polyurethane resin (7) | BYK-333 | None | Specific developer C2 | 0 | No stain |
| Example C8 | 8 | Cyanine dye A | Polyurethane resin (7) | TEGO GLIDE 410 | None | Specific developer C2 | 0 | No stain |
| Example C9 | 9 | Cyanine dye A | Polyurethane resin (7) | BYK-333 | Cyanine dye A | Specific developer C2 | 0 | No stain |
| Example C10 | 7 | Cyanine dye A | Polyurethane resin (7) | BYK-333 | None | Specific developer C1 | 0 | No stain |
| Example C11 | 7 | Cyanine dye A | Polyurethane resin (7) | BYK-333 | None | Specific developer C3 | 0 | No stain |
| Example C12 | 7 | Cyanine dye A | Polyurethane resin (7) | BYK-333 | None | Specific developer C4 | 0 | No stain |
| Example C13 | 7 | Cyanine dye A | Polyurethane resin (7) | BYK-333 | None | Specific developer C5 | 0 | No stain |
| Comparative Example C1 | 10 | Cyanine dye A | Polyurethane resin (7) | None | None | Specific developer C2 | 10 | No stain |
| Comparative Example C2 | 11 | Cyanine dye A | Comparative resin (1) | BYK-333 | None | Specific developer C2 | 100 | No stain |
| Comparative Example C3 | 12 | None | Polyurethane resin (7) | BYK-333 | Cyanine dye A | Specific developer C2 | 0 | Slight scumming |
| Comparative Example C4 | 7 | Cyanine dye A | Polyurethane resin (7) | BYK-333 | None | Comparative developer C1 | 50 | Scumming |
| Comparative Example C5 | 7 | Cyanine dye A | Polyurethane resin (7) | BYK-333 | None | Comparative developer C2 | 25 | Scumming |

Table 3 shows that in the method for making a planographic printing plate according to the third aspect of the invention, generation of wastes in the development bath is prevented, and good developability is achieved, in spite of the one-bath treatment using a weak alkaline developer. Further, the planographic printing plates obtained by the making method provided printed materials with high quality images.

On the other hand, in Comparative Example C1 containing no polyorganosiloxane, Comparative Example C2 containing no polyurethane, Comparative Example C3 containing no infrared ray absorbing agent in the lower layer, and Comparative Examples C4 and C5 which used the developers that do not fall within the scope of the invention, generation of development wastes and background stains were observed.

What is claimed is:

1. A method of making a planographic printing plate, comprising, in the following order:
    subjecting a planographic printing plate precursor, which comprises a support and a positive-working image recording layer provided on the support, to image-wise exposure; and
    developing the planographic printing plate precursor using an alkaline aqueous solution which comprises an anionic surfactant and has a pH of from 8.5 to 10.8, the recording layer comprising: a lower layer comprising a (A) water-insoluble and alkali-soluble resin and an (B) infrared ray absorbing agent; and an upper layer comprising a (C) water-insoluble and alkali-soluble polyurethane resin that comprises a urethane bond in its main chain and a (D) polyorganosiloxane.

2. The method of making a planographic printing plate according to claim 1, wherein the (A) water-insoluble and alkali-soluble resin comprises a resin having at least one group selected from the group consisting of a phenolic hydroxyl group, a carboxyl group, sulfonic acid group, a phosphoric acid group, a sulfonamide group, and an active imide group.

3. The method of making a planographic printing plate according to claim 1, wherein the (B) infrared ray absorbing agent comprises a cyanine dye.

4. The method of making a planographic printing plate according to claim 1, wherein the (C) water-insoluble and alkali-soluble polyurethane resin comprises a polyurethane resin having a carboxyl group in a polymer backbone thereof.

5. The method of making a planographic printing plate according to claim 1, wherein the (C) water-insoluble and alkali-soluble polyurethane resin comprises a polyurethane resin whose basic skeleton is a reaction product of a diisocyanate compound represented by the following Formula (I) with at least one carboxylic diol compound represented by the following Formula (II) or (III):

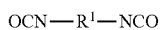
Formula (I)

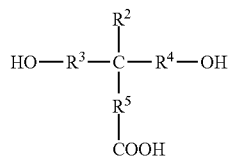
Formula (II)

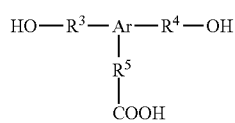
Formula (III)

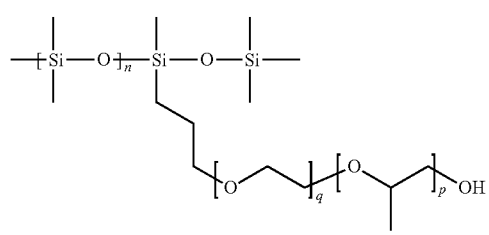
(a)

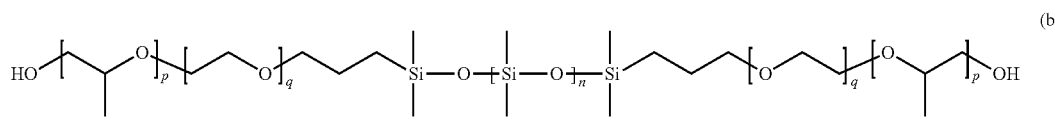
(b)

wherein in Formula (I), $R^1$ represents a divalent linking group;

in Formula (II), $R^2$ represents a hydrogen atom, a substituted or unsubstituted alkyl group, a substituted or unsubstituted aralkyl group, a substituted or unsubstituted aryl group, a substituted or unsubstituted alkoxy group, or a substituted or unsubstituted aryloxy group;

in Formula (II) or (III), $R^3$, $R^4$, and $R^5$ each represent a single bond or a divalent linking group; and in Formula (III), Ar represents a trivalent aromatic hydrocarbon group which may have a substituent.

6. The method of making a planographic printing plate according to claim 5, wherein in Formula (II) or (III), wherein $R^3$, $R^4$, and $R^5$ in Formula (II) or (III) each independently represent an unsubstituted alkylene group having 1 to 20 carbon atoms, or an unsubstituted arylene group having 6 to 15 carbon atoms.

7. The method of making a planographic printing plate according to claim 1, wherein the (D) polyorganosiloxane comprises at least one selected from the group consisting of a polyether-modified polyorganosiloxane, an alcohol-modified polyorganosiloxane, and a carboxyl-modified polyorganosiloxane.

8. The method of making a planographic printing plate according to claim 1, wherein the (D) polyorganosiloxane comprises a compound obtained by hydrolysis condensation of an alkoxysilane in a compound represented by the following Formula (A):

$$RSi(OR')_3 \quad (A)$$

wherein in Formula (A), R represents an alkyl group or an aryl group, and R's each independently represent an alkyl group.

9. The method of making a planographic printing plate according to claim 1, wherein the (D) polyorganosiloxane comprises at least one selected from the group consisting of a graft block polysiloxane represented by the following Formula (a) and a block polysiloxane represented by the following Formula (b):

wherein in Formulae (a) and (b), n, p, and q each independently represent an integer of 1 or more.

10. The method of making a planographic printing plate according to claim 1, wherein the anionic surfactant comprises an anionic surfactant containing a sulfonic acid or a sulfonate.

11. The method of making a planographic printing plate according to claim 1, wherein a content of the anionic surfactant is from 0.5 to 15% by mass.

12. The method of making a planographic printing plate according to claim 1, wherein the upper layer further comprises a (B) infrared ray absorbing agent.

13. The method of making a planographic printing plate according to claim 1, wherein a content of a water-soluble polymer compound in the alkaline aqueous solution is 10 ppm or less.

14. The method of making a planographic printing plate according to claim 1, wherein the development comprises a one-bath treatment using the alkaline aqueous solution.

15. The method of making a planographic printing plate according to claim 14, wherein the one-bath treatment further comprises a pre-washing treatment and a gumming treatment.

* * * * *